(12) United States Patent
Sen et al.

(10) Patent No.: US 10,770,983 B2
(45) Date of Patent: Sep. 8, 2020

(54) CIRCUITS AND METHODS FOR SECONDARY-SIDE RECTIFIED VOLTAGE SENSING IN ISOLATED SWITCHED-MODE POWER CONVERTERS

(71) Applicant: Infineon Technologies Austria AG, Villach (AT)

(72) Inventors: Sujata Sen, Marina Del Rey, CA (US); Ronald Hulfachor, Nashua, NH (US); Sue Perranoski, Rancho Palos Verdes, CA (US); Cha-Fu Tsai, Torrance, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/211,953

(22) Filed: Dec. 6, 2018

(65) Prior Publication Data

US 2020/0186047 A1 Jun. 11, 2020

(51) Int. Cl.
*H02M 3/335* (2006.01)
*H03K 3/356* (2006.01)
(Continued)

(52) U.S. Cl.
CPC .... *H02M 3/33592* (2013.01); *G01R 19/2503* (2013.01); *G01R 19/2509* (2013.01);
(Continued)

(58) Field of Classification Search
CPC ......... H02M 3/33538; H02M 3/33546; H02M 3/33515; H02M 3/33576; H02M 3/33592;
(Continued)

(56) References Cited

U.S. PATENT DOCUMENTS 5,862,044 A 1/1999 Shioya et al.
6,486,642 B1 11/2002 Qian
(Continued)

FOREIGN PATENT DOCUMENTS

EP 1978625 A2 10/2008
JP 2015167443 A 9/2015

OTHER PUBLICATIONS

Tang, Benjamim, et al., "Feedforward Enhanced Feedback Control in Isolated Switched-Mode Power Converters with Secondary-Side Rectified Voltage Sensing", U.S. Appl. No. 16/109,254, filed Aug. 22, 2018.

*Primary Examiner* — Bryan R Perez
(74) *Attorney, Agent, or Firm* — Murphy, Bilak & Homiller, PLLC

(57) ABSTRACT

An isolated switched-mode power converter converts power from an input source into power for an output load. A digital controller senses a secondary-side voltage, such as a rectified voltage, of the power converter. The secondary-side voltage is divided down using a high-impedance voltage divider. The resultant divided-down voltage is provided to a voltage sensor within the digital controller. The voltage sensor level shifts the provided voltage, and buffers the resulting level-shifted voltage. The buffered, level-shifted voltage is provided to a tracking analog-to-digital converter (ADC) for digitization. The buffered signal provided to the tracking ADC has a high current capability, such that the voltage input to the tracking ADC may quickly converge before the tracking ADC outputs a digital value for the sensed secondary-side voltage.

23 Claims, 8 Drawing Sheets

(51) Int. Cl.
   *G01R 19/25* (2006.01)
   *H03M 1/06* (2006.01)
(52) U.S. Cl.
   CPC .... *H03K 3/356017* (2013.01); *H03M 1/0607* (2013.01); *H02M 3/33515* (2013.01)
(58) Field of Classification Search
   CPC ............. H02M 3/33507; H02M 3/335; H02M 3/3353; H02M 3/33569
   See application file for complete search history.

(56) References Cited

U.S. PATENT DOCUMENTS

| | | |
|---|---|---|
| 6,674,278 B1 | 1/2004 | Uesugi |
| 9,397,578 B2 | 7/2016 | Karlsson et al. |
| 9,812,971 B1 | 11/2017 | Tschirhart et al. |
| 9,812,979 B1 | 11/2017 | Tschirhart |
| 9,825,546 B2 | 11/2017 | Tang et al. |
| 9,837,907 B1 | 12/2017 | Babazadeh et al. |
| 9,929,663 B1 | 3/2018 | Babazadeh et al. |
| 2004/0233685 A1 | 11/2004 | Matsuo et al. |
| 2005/0226014 A1 | 10/2005 | Chang |
| 2005/0286272 A1 | 12/2005 | Iwamoto et al. |
| 2006/0139967 A1 | 6/2006 | Quitayen |
| 2007/0247084 A1 | 10/2007 | Zhao |
| 2008/0007977 A1 | 1/2008 | Piper et al. |
| 2008/0055944 A1 | 3/2008 | Wang et al. |
| 2009/0146643 A1 | 6/2009 | Ostrom et al. |
| 2010/0109648 A1 | 5/2010 | Cheung |
| 2010/0237843 A1 | 9/2010 | Rivet et al. |
| 2012/0218793 A1 | 8/2012 | Springett et al. |
| 2013/0003420 A1 | 1/2013 | Ye |
| 2013/0113286 A1* | 5/2013 | Farrenkopf ......... H02M 3/1582 307/43 |
| 2013/0169212 A1 | 7/2013 | Sun et al. |
| 2013/0308347 A1 | 11/2013 | Sato et al. |
| 2014/0192565 A1 | 7/2014 | Wang |
| 2014/0198535 A1* | 7/2014 | Yang ................. H02M 3/33523 363/16 |
| 2014/0254206 A1 | 9/2014 | Ou et al. |
| 2014/0376281 A1* | 12/2014 | Ohashi ................. H02M 3/158 363/25 |
| 2015/0070950 A1 | 3/2015 | Myhre et al. |
| 2015/0091460 A1 | 4/2015 | Kato et al. |
| 2015/0115911 A1 | 4/2015 | Parto et al. |
| 2015/0115919 A1* | 4/2015 | Yang ...................... H02M 1/32 323/282 |
| 2015/0236596 A1 | 8/2015 | Fan |
| 2015/0244279 A1 | 8/2015 | Takagi et al. |
| 2015/0249391 A1 | 9/2015 | Yang et al. |
| 2015/0268280 A1 | 9/2015 | Miljanic et al. |
| 2015/0349573 A1 | 12/2015 | Tschirhart |
| 2015/0365006 A1 | 12/2015 | Choi |
| 2016/0028313 A1 | 1/2016 | Kong et al. |
| 2016/0036340 A1 | 2/2016 | Kikuchi et al. |
| 2016/0072392 A1 | 3/2016 | Soares et al. |
| 2016/0072399 A1 | 3/2016 | Kikuchi et al. |
| 2016/0261200 A1 | 9/2016 | Yabuzaki |
| 2016/0352231 A1 | 12/2016 | Quigley |
| 2017/0155335 A1 | 6/2017 | Chang et al. |
| 2017/0163144 A1 | 6/2017 | Boncato et al. |
| 2017/0179809 A1 | 6/2017 | Choi |
| 2017/0307662 A1 | 10/2017 | Miljanic et al. |
| 2017/0317595 A1 | 11/2017 | Babazadeh et al. |
| 2017/0331386 A1 | 11/2017 | Babazadeh |
| 2018/0062523 A1 | 3/2018 | Rainer et al. |
| 2018/0152111 A1 | 5/2018 | Tschirhart et al. |
| 2018/0175738 A1 | 6/2018 | Kikuchi |
| 2019/0013727 A1 | 1/2019 | Ke |
| 2019/0260282 A1 | 8/2019 | Oh et al. |

* cited by examiner

CIRCUITS AND METHODS FOR SECONDARY-SIDE RECTIFIED VOLTAGE SENSING IN ISOLATED SWITCHED-MODE POWER CONVERTERS

TECHNICAL FIELD

The present application relates to isolated switched-mode power converters and, in particular, relates to circuits and related methods for sensing a voltage, such as a rectified voltage, on the secondary side of an isolated switched-mode power converter.

BACKGROUND

Isolated switched-mode direct-current (DC) to DC power converters use a transformer to convert power from an input source into power for an output load. Such power converters include power switches that convert DC input power into alternating current (AC) power that is fed to the primary side of the transformer. AC power supplied on the secondary side of the transformer is rectified and filtered so as to provide DC power to the output load. The primary-side power switches are typically controlled by pulse-width-modulated (PWM) control signals. A controller generates the PWM control signals with a frequency and duty cycle that are appropriate to meet the power needs of the output load.

The controller typically uses a linear closed-loop feedback technique to maintain the output voltage near a desired target. The controller may be implemented using analog or digital circuitry, and may be located on the primary or secondary side of the power converter. So as to maintain the integrity of the isolation barrier of the power converter, any signals crossing between the primary and secondary sides must pass through isolators, e.g., transformers, opto-couplers. Isolated switched-mode power converters increasingly use digital controllers that are located on the secondary side, so as to avoid passing the output voltage, which must be sensed by the controller for linear closed-loop feedback control, through an analog isolator at the primary-to-secondary boundary. Furthermore, locating the controller on the secondary side allows for ready communication between the controller and components of the output load, e.g., for load management, without requiring isolators.

However, some techniques used by the controller may require information regarding the input voltage or current of the primary side of the power converter. For example, a linear feedback control technique may be augmented with feedforward control techniques so as to quickly compensate for input voltage transients. However, feedforward control techniques require use of the input voltage, or an estimate thereof, from the primary side. Similarly, the controller may need to detect primary-side fault conditions, which also requires information regarding the input voltage or current. The input voltage or current may be directly sensed by a secondary-side controller, but this requires an analog isolator which is preferably avoided. Alternatively, the input voltage or current may be estimated based upon the output voltage or current, which may be sensed on the secondary side of the power converter. However, the output voltage is low-pass filtered, typically by an output capacitor and the load resistance. The delay incurred by the low-pass output filter means that changes in the input voltage are only detectable in the output voltage after a considerable time lag. Such a lag may make use of the output voltage unfeasible for purposes of feedforward control and/or detection of primary-side faults.

A rectified voltage is typically available on the secondary side of an isolated power converter prior to the output filter, i.e., between the transformer and the output filter. Input voltage transients may be detected in the rectified voltage without incurring the delay of the output filter. Hence, the rectified voltage may be used to estimate the input voltage with only a minimal delay. The rectified voltage may also be used for other purposes, including estimating the magnetic flux of the transformer and measuring the time delay between issuance of PWM control signals and corresponding pulses in the rectified voltage.

To meet such goals, circuits and methods are needed that are capable of accurately sensing secondary-side voltages, including a rectified voltage, which may be rapidly changing. Such sensing should be power efficient and the associated circuitry should be feasible for implementation within a digital controller on the secondary side of an isolated power converter

SUMMARY

According to an embodiment of a voltage sensor for tracking a secondary-side voltage of an isolated switched-mode power converter, the voltage sensor comprises a first sense terminal, a first level shifter, a first input buffer, and a tracking analog-to-digital converter (ADC). The first sense terminal is for connection to a node of the secondary-side voltage that is being tracked, and has a first sense voltage. The first level shifter is configured to shift the first sense voltage, thereby providing a first level-shifted voltage. This first level-shifted voltage is provided to the first input buffer, which outputs a first buffered output having a voltage corresponding to the first level-shifted voltage, and having a first buffered current which is higher than a current input to the first input buffer. The tracking ADC digitizes the first buffered output so as to provide a digital value corresponding to the secondary-side voltage that is being tracked.

According to an embodiment of a method for sensing a secondary-side voltage within an isolated switched-mode power converter, the method comprises sensing a first sense voltage at a first sense terminal, wherein the first sense voltage corresponds to the secondary-side voltage. The first sense voltage is shifted, thereby providing a first level-shifted voltage. The first level-shifted voltage is buffered, so as to provide a first buffered output having a voltage corresponding to the first level-shifted voltage. The available current driven from the first buffered output is higher than the input current of the first input buffer. The output of the first buffer is digitized using a tracking analog-to-digital converter (ADC), so as to provide a digital value corresponding to the secondary-side voltage.

According to an embodiment of a switched-mode power converter using an isolated topology for converting power from an input source into power for an output load, the switched-mode power converter comprises a primary side, a transformer, and a secondary side. The primary side includes a power stage, coupled to the input source, which includes one or more power switches. The transformer includes a primary winding coupled to the power stage and a secondary winding. The secondary side includes a rectifier circuit, a filter circuit, and a voltage sensor. The rectifier circuit is coupled to the secondary winding and provides a first rectified voltage at a first rectified voltage node. The filter circuit is interposed between the first rectified voltage node and an output of the switched-mode power converter. The filter circuit is configured to filter the first rectified voltage and provides a filtered voltage at the output. The voltage sensor comprises circuitry that is largely the same as the voltage sensor described above, but additionally includes a resistive voltage divider which couples the secondary side voltage node being sensed to a sense terminal of the voltage sensor.

According to an embodiment of an alternative switched-mode power converter using an isolated topology for converting power from an input source into power for an output load, the switched-mode power converter comprises a primary side, a transformer, and a secondary side. These circuits are largely the same as the corresponding circuits of the switched-mode power converter described above, except for the voltage sensor of the secondary side. The voltage sensor of the alternative power converter is configured to estimate a voltage of the input source based upon a first rectified voltage. This voltage sensor comprises a first sense terminal, a front end and a tracking analog-to-digital converter (ADC).

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description that follows.

DETAILED DESCRIPTION

Figure 1:
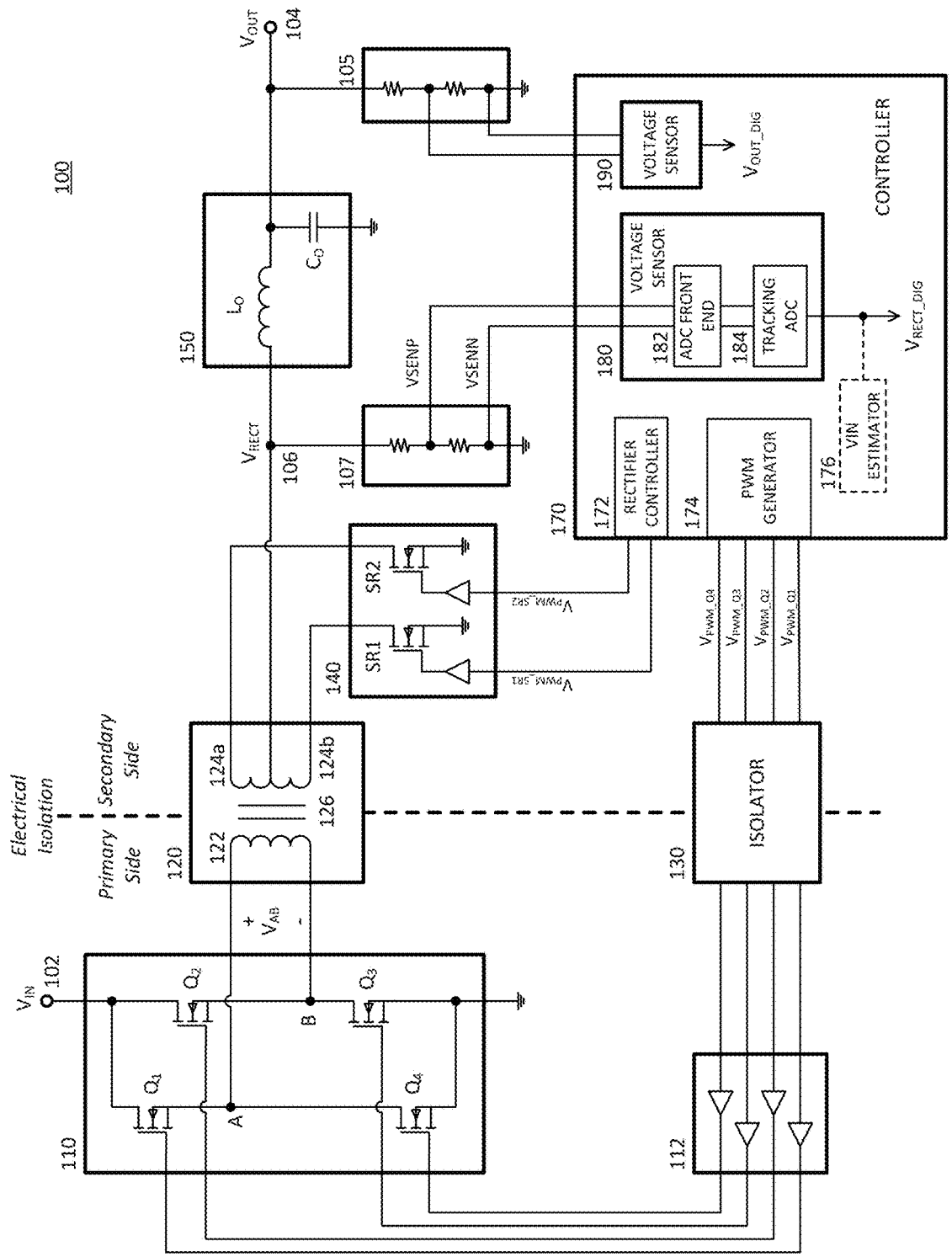
FIG. 1 illustrates a circuit diagram of an isolated switched-mode power converter which includes a controller having a voltage sensor for sensing secondary-side voltages.

The embodiments described herein provide circuits and related methods for sensing a voltage on the secondary side of an isolated switched-mode power converter. While the voltage sensor circuitry described herein may be used to sense an output voltage of a power converter, this circuitry provides particular benefits when used for sensing a rectified voltage of an isolated switched-mode power converter, and the circuitry will be described primarily in the context of sensing a rectified voltage. Such a rectified voltage may be sensed at one or more rectified voltage nodes located at the output of a secondary-side rectifier, wherein the rectified voltage node(s) typically provide a rectified voltage to an output filter of the power converter. The rectified voltage typically consists of a series of approximately square pulses, i.e., a square wave. Sensing and digitizing such a rectified voltage requires voltage sensing circuitry that has a high bandwidth, i.e., that can detect and track a steep rising or falling edge of a square wave, and that can accurately track the rectified voltage during its active pulses. In a typical application, the voltage sensing circuitry provides, at least, a digital voltage sample corresponding to each rectified voltage pulse. Depending upon the rectifier circuit topology, one or two such rectified voltage pulses may be produced for each switching cycle of the power converter, meaning that the voltage sensor typically provides a voltage sample once or twice per each switching cycle.

In addition to providing digitized voltage samples, the voltage sensor also provides timing signals corresponding to the rising and falling edges of a rectified voltage pulse. Such timing signals may be used to measure pulse widths for purposes such as calculating a volt-second measure for the transformer magnetic flux, for detecting primary-side fault conditions, and for determining a delay from the setting of PWM signals by a digital controller until a corresponding rectified voltage pulse occurs on the secondary side.

The voltage sensor circuitry is preferably integrated within a secondary-side digital controller, in which case such circuitry must be feasible for implementation using the same process technology used in fabricating the digital controller. The secondary-side voltage to be sensed must typically be shifted to a voltage range that is feasible for input to the digital controller. This may be accomplished using a resistive voltage divider. For example, the rectified voltage may alternate between 0V and 12V, whereas the inputs to the digital controller may only be capable of handling voltages up to about 3V, thereby requiring a 4:1 voltage division. So as to minimize power loss within the voltage divider, the resistance of the voltage divider should be large. However, the large resistance of such a voltage divider limits the current available for driving an analog-to-digital converter (ADC) within the digital controller. Stated alternatively, the large resistance, in conjunction with the input capacitance of an ADC within the digital controller, forms a low-pass filter that restricts the speed with which the ADC can track the secondary-side voltage being sensed.

The circuits and methods described below address these issues by introducing front-end circuitry for a tracking ADC. The front end serves to level shift and buffer a secondary-side voltage, as provided by a voltage divider. The resultant level-shifted and buffered voltage is provided to the tracking ADC. The voltage sensor circuitry can track a secondary-side voltage with minimal delay and without significantly affecting rise or fall times of pulses of the secondary-side voltage. Furthermore, the described circuitry is feasible for implementation using a digital or mixed-signal process technology, as is typically used for fabricating power converter controllers.

The following detailed description and the associated figures provide embodiments of voltage sensor circuits and related methods for sensing secondary-side voltages within power converters. The described embodiments provide particular examples for purposes of explanation, and are not meant to be limiting. Features and aspects from the example embodiments may be combined or re-arranged, except where the context does not allow this.

The described voltage sensor circuits may be used to sense a secondary-side rectified voltage which, in turn, may be used to estimate an input voltage of an isolated power converter. The accuracy and minimal delay of the voltage sensing allows for the estimated input voltage to be used by the digital controller for purposes such as feedforward control to address input voltage transients, and for the detection of primary-side fault conditions.

The voltage sensor circuitry is initially described within an embodiment of an isolated switched-mode power converter which uses a full-bridge power stage on the primary side and a center-tapped secondary winding. This is followed by more detailed circuitry for a voltage sensor that comprises a level shifter, a buffer stage, and a tracking analog-to-digital converter (ADC). An alternative level shifter, which includes various error compensation circuits to improve accuracy, is described next, followed by front-end circuitry that corrects long-term drift errors. Waveforms corresponding to voltages and other signals within the voltage converter are described next. This is followed by another alternative ADC front-end that uses a current amplifier rather than the level shifters and buffers of the previous ADC front end. Finally, a method for voltage sensing is described.

Voltage Sensing within an Isolated Switched-Mode Power Converter

FIG. 1 illustrates an isolated switched-mode power converter 100 comprising, notably, voltage sensors 180, 190 for sensing secondary-side voltages. The power converter 100 further includes an input 102, an output 104, a rectified voltage node 106, a power stage 110, a transformer 120, an isolator 130, a rectifier 140, an output filter 150, and a digital controller 170. The input 102 is for coupling to an input power supply, and is supplied with an input voltage $V_{IN}$. The output 104 is for coupling to an output load, e.g., a microprocessor, and provides an output voltage $V_{OUT}$. Electrical (galvanic) isolation is provided by the transformer 120 and the isolator 130, which together partition the power converter 100 into a primary side and a secondary side, as shown in FIG. 1.

The input voltage $V_{IN}$, from the input power supply, is provided to the power stage 110, which couples this voltage to the transformer 120 using power switches. The illustrated power stage 110 includes four power switches $Q_1$, $Q_2$, $Q_3$, $Q_4$, which are oriented in a full-bridge configuration. The power switches are controlled via drivers 112 that are connected to switch control signals output from the isolator 130. During an active interval within a positive half cycle of the power converter 100, the switches $Q_1$ and $Q_3$ are set to conduct, thereby providing a positive voltage to the transformer 120 across its input $V_{AB}$. During an active interval within a negative half cycle of the power converter 100, the switches $Q_2$ and $Q_4$ are set to conduct, thereby providing a negative voltage to the transformer 120 across its input $V_{AB}$. Additionally, there may be idle intervals during which none of the switches $Q_1$, $Q_2$, $Q_3$, $Q_4$ conduct and no voltage is provided to the transformer 120 across $V_{AB}$.

The power switches $Q_1$, $Q_2$, $Q_3$, $Q_4$ illustrated in FIG. 1 are metal-oxide-semiconductor field-effect transistors (MOSFETs), e.g., enhancement-mode MOSFETs, but other switch types may be used. For example, junction field-effect transistors (JFETs), bipolar junction transistors (BJTs), insulated gate bipolar transistors (IGBTs), high electron mobility transistors (HEMTs), or other types of power transistors may be preferred in some applications.

The transformer 120 includes a primary winding 122 having N1 turns, secondary windings 124a, 124b having N2 turns each, and a core 126. The secondary windings 124a, 124b are connected together at a center tap. A rectified voltage node 106 having a rectified voltage $V_{RECT}$ is coupled to this center tap. Neglecting practical effects such as resistive losses and a leakage inductance of the transformer 120, the turns ratio N2/N1 determines the ratio of the rectified voltage $V_{RECT}$ to the magnitude of the input voltage $V_{AB}$ of the transformer 120.

The rectifier circuit 140 is configured to rectify the voltage output from the secondary windings 124a, 124b, so as to provide the rectified voltage $V_{RECT}$ at the rectified voltage node 106. As shown in FIG. 1, the rectifier circuit 140 comprises rectification switches SR1 and SR2, each of which has an associated driver. The rectification switches SR1, SR2 are controlled by a rectifier controller 172, preferably located within the controller 170. Other rectification circuits or techniques may be used. For example, diodes may couple each outer terminal of the secondary windings 124a, 124b to a rectified voltage node, while the center tap is coupled to a ground of the load. In another alternate configuration, four diodes in a bridge configuration may be used with a secondary winding that has no center tap. In general, diode-based rectification is not preferred, particularly for low secondary-side voltages, due to the power loss associated with diodes, as compared with active rectification using power switches SR1, SR2, as shown in FIG. 1. The illustrated rectification switches SR1, SR2 are enhancement-mode MOSFETS but, as with the power switches $Q_1$, $Q_2$, $Q_3$, $Q_4$, other switch types may be preferred in some applications.

The output filter 150 low-pass filters the rectified voltage $V_{RECT}$ using an output inductor $L_O$ and an output capacitor $C_O$. (Other filter types, including higher order filters and/or active filters, may be preferred in some applications.) The resultant filtered output voltage $V_{OUT}$ is provided to the output 104, for coupling to a load (not illustrated) of the power converter 100. Note that the rectified voltage $V_{RECT}$ consists of a sequence of pulses having a frequency corresponding to a switching frequency of the power stage 110, whereas the filtered output voltage $V_{OUT}$ is relatively constant. Also, note that the filter 150 produces a significant delay between voltage changes at its input (rectified voltage node 106) and the output node 104, and that this delay is dependent upon the amount of current drawn by a load coupled to the output 104.

The controller 170 and its constituent parts may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The controller 170 may also include memory, e.g., non-volatile memory such as flash, that includes instructions or data for use by the processor circuitry, and one or more timers. The controller 170 inputs sensor signals such as signals corresponding to the output voltage $V_{OUT}$ and the rectified voltage $V_{RECT}$.

The controller 170 is responsible for controlling the power converter 100 so as to supply necessary power to the load. The controller 170 senses the rectified voltage $V_{RECT}$ and the output voltage $V_{OUT}$, and uses the sensed voltages to generate control signals $V_{PWM\_SR1}$, $V_{PWM\_SR2}$, $V_{PWM\_Q1}$, $V_{PWM\_Q2}$, $V_{PWM\_Q3}$, $V_{PWM\_Q4}$ for controlling the power switches of the rectifier circuit 140 and the power stage 110.

The rectifier controller 172 generates control signals $V_{PWM\_SR}$, $V_{PWM\_SR2}$ for the rectifier switches SR1, SR2 so as to provide the (non-negative) rectified voltage $V_{RECT}$ at the rectified voltage node 106. These control signals $V_{PWM\_SR1}$, $V_{PWM\_SR2}$ may be based upon a sensed version of the rectified voltage $V_{RECT}$, signals provided by a PWM generator 174, and/or a sensed current flowing through the rectifier switches SR1, SR2. (For ease of illustration, such current sensing is not shown.) Because such rectification techniques are well-known in the art, further detail regarding the rectifier controller 172 is not provided.

The controller 170 also includes the PWM generator 174, which generates switch control signals $V_{PWM\_Q1}$, $V_{PWM\_Q2}$, $V_{PWM\_Q3}$, $V_{PWM\_Q4}$ for controlling the power switches of the power stage 110. The switch control signals $V_{PWM\_Q1}$, $V_{PWM\_Q2}$, $V_{PWM\_Q3}$, $V_{PWM\_Q4}$ output from the controller 170 are provided to the secondary side of the isolator 130 which, in turn, provides primary-side control signals to the drivers 112. The PWM generator 174 typically includes a linear feedback controller, such as a proportional-integral-derivative (PID) controller. The PWM generator 174 inputs a sensed version, e.g., $V_{OUT\_DIG}$, of the output voltage $V_{OUT}$, as provided by the voltage sensor 190, and compares this voltage against a reference (target) voltage $V_{TARGET}$ to determine control parameters for generating the switch control signals.

There are several control techniques that may be used by the PWM generator 174. For example, the PWM generator 174 might generate control signals having a fixed switching frequency and variable duty cycle, in which case the determined control parameter is a duty cycle. Alternatively, the PWM generator 174 might generate control signals having fixed pulse widths and variable frequencies, in which case the control parameter is a switching frequency. In another alternative, the PWM generator 174 may generate phase-shift-modulated (PSM) signals, in which case the control parameter is a phase shift. These and other techniques are well known within the field of feedback control. Because such techniques are well known and are not crucial to understanding the unique aspects of the voltage sensing circuitry described herein, further details regarding such control techniques are not provided.

A conditioning circuit 107 conditions the rectified voltage $V_{RECT}$ to provide voltages VSENP, VSENN that are appropriate for sensing by the voltage sensor 180 within the controller 170. For example, the conditioning circuit 107 may shift the rectified voltage $V_{RECT}$ to a range within voltage input limits of the controller 170 and the voltage sensor 180. While the conditioning circuit 107 is illustrated in FIG. 1 as a resistive voltage divider, it may additionally or alternatively include filters, amplifiers, etc. in some implementations. A similar conditioning circuit 105 conditions the output voltage $V_{OUT}$ to provide voltages that are appropriate for sensing by a second voltage sensor 190. The conditioning circuit 105 is also shown as a resistive voltage divider, but may include other components in some applications. In preferred implementations, the conditioning circuits 107, 105, regardless of their particular topology, provide high impedances to the secondary-side voltages that are being sensed (e.g., $V_{RECT}$, $V_{OUT}$), so as to minimize power loss incurred by the voltage sensing.

The voltage sensor 180 comprises a tracking ADC 184 and an ADC front end 182. Because the conditioning circuit 107 has a high impedance, it typically cannot provide high current levels to the voltage sensor 180, as are needed for fast digitization of the voltages VSENP, VSENN. As is explained in detail in the embodiments described below, the ADC front end 182 provides voltage level shifting and/or buffering so as to provide the tracking ADC 184 with high current levels that enable fast voltage settling and subsequent digitization. The ADC front end 182 may additionally include an edge detector (not shown for ease of illustration) for detecting the rising edge of a rectified voltage pulse, which may be used, e.g., to assist the tracking ADC 184 in quickly slewing to a steady-state value of the rectified voltage pulse. Additionally, the edge detector may be used to determine the width of rectified voltage pulses. Furthermore, the controller 170 may use timing signals from the PWM generator 174 and the edge detector to determine a time delay from the generation of PWM control signals, e.g., $V_{PWM\_Q1}$, $V_{PWM\_Q3}$, until a corresponding rectified voltage pulse at the rectified voltage node 106.

A digitized voltage $V_{RECT\_DIG}$ is output from the voltage sensor 180, and may be provided to a $V_{IN}$ estimator 176, which is illustrated as optional. The $V_{IN}$ estimator 176 inputs the digitized voltage $V_{RECT\_DIG}$, corresponding to a rectified voltage pulse, and estimates the input voltage $V_{IN}$, e.g., based upon the digitized voltage $V_{RECT\_DIG}$ and the turns ratio N2/N1 of the transformer 120. The controller 170 may use the digitized voltage $V_{RECT\_DIG}$ or, similarly, the estimated input voltage $V_{IN}$ for feedforward control, fault detection, transformer flux estimation, etc. Because such usage of an input voltage $V_{IN}$ is generally known and is not required to understand the unique aspects of this invention, which relate to voltage sensing circuits and methods, such usage is not described in further detail.

A second voltage sensor 190 is shown for sensing the output voltage $V_{OUT}$, and outputs a digitized sensed output voltage $V_{OUT\_DIG}$. The second voltage sensor 190 may be configured as is the voltage sensor 180.

Voltage Sensor Circuit with Level Shifting and Buffering

Figure 2:
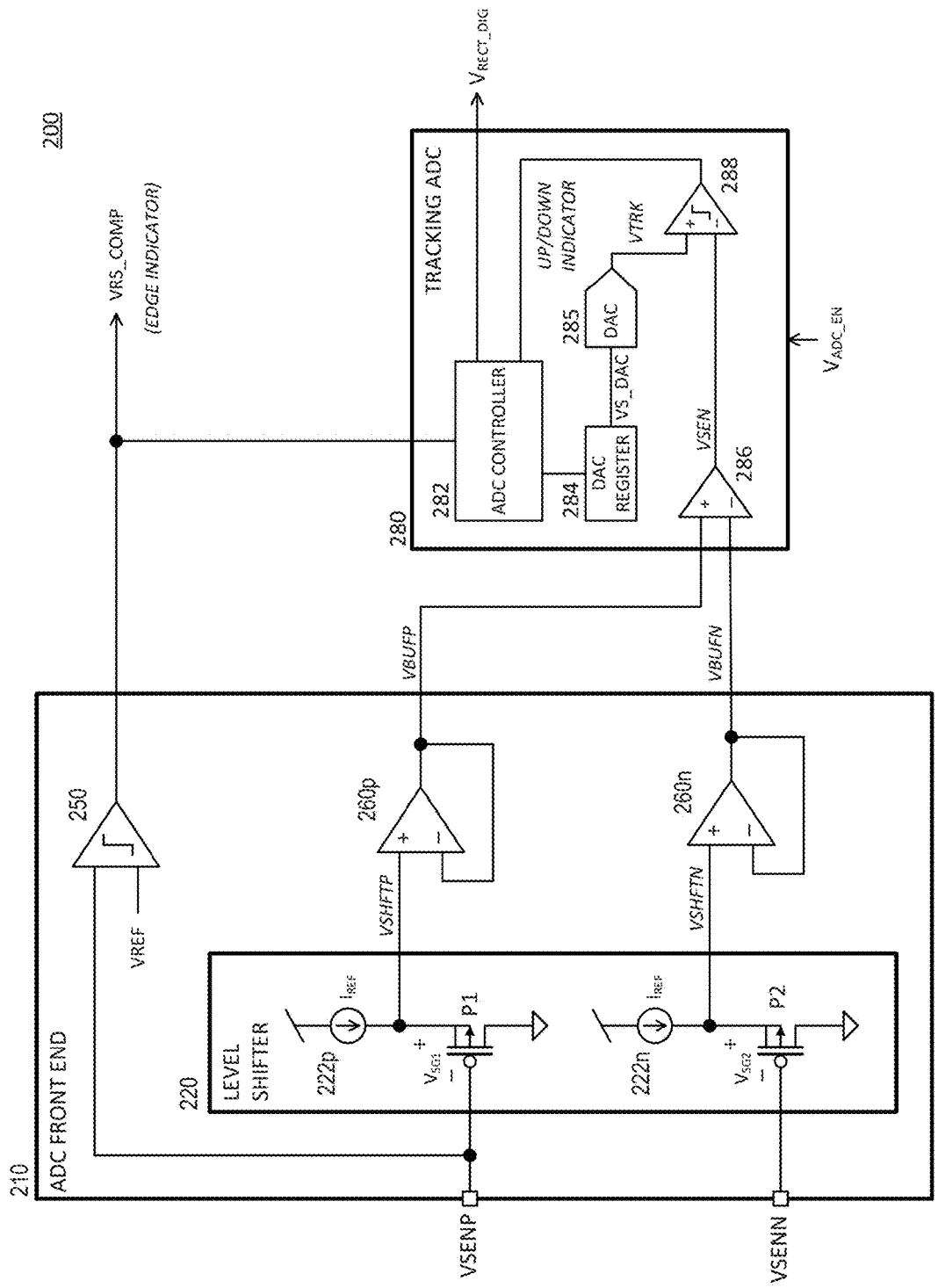
FIG. 2 illustrates circuitry for a voltage sensor, such as the voltage sensor of FIG. 1, including a tracking analog-to-digital converter (ADC) and an ADC front end.

FIG. 2 illustrates an embodiment of a voltage sensor 200, as could be used in the power converter 100 of FIG. 1. The voltage sensor 200 includes a tracking ADC 280 and an ADC front end 210. The voltage sensor 200 inputs first and second voltages VSENP, VSENN and outputs a digitized value $V_{RECT\_DIG}$ corresponding to the difference between these voltages VSENP, VSENN.

The ADC front end 210 is configured to input a secondary-side voltage, such as the rectified voltage $V_{RECT}$, through a high-impedance resistive voltage divider, e.g., the conditioning circuit 107 shown in FIG. 1. Presuming that the voltage pulses of the rectified voltage $V_{RECT}$ have adequate durations, the voltage sensor 200 provides measurements $V_{RECT\_DIG}$ corresponding to the rectified voltage $V_{RECT}$ at least once per voltage pulse, which corresponds to at least once or twice per switching cycle of the power converter. (A full bridge or similar rectifier produces two rectified voltage pulses for each switching cycle, whereas a half bridge or similar rectifier produces only one rectified voltage pulse per switching cycle.) The rectified voltage measurement $V_{RECT\_DIG}$ may be used to estimate the input voltage $V_{IN}$. The ADC front end 210 supports tracking of fast transients, e.g., corresponding to $V_{IN}$ transients having slopes up to 7V/μs, and the tracking of relatively narrow rectified voltage pulses, e.g., as low as 350 ns. Furthermore, the voltage sensor 200 detects rising and falling edges that may be used to determine the width of rectified voltage pulses and/or a time delay between when an active interval is commanded, e.g., by the PWM generator 174, and when a corresponding rectified voltage pulse is sensed on the secondary side. The voltage sensor 200 senses voltages down to 0V.

The tracking ADC 280 digitizes a differential input voltage (VBUFP−VBUFN) by matching the input voltage to a voltage VTRK that is generated within the tracking ADC 280. A low input impedance differential amplifier 286 generates an input voltage VSEN from the differential input voltage (VBUFP−VBUFN) provided to the tracking ADC 280. (The illustrated amplifier 286 provides unity gain, i.e., VSEN=VBUFP−VBUFN. In other embodiments, a variant amplifier may provide a non-unity gain so as to match the voltage range of VSEN to the voltage range of VTRK.) Because the differential amplifier 286 has low input impedance, the voltage levels at its inputs quickly slew to new levels after a voltage transient, provided adequate current is provided to its inputs. A digital-to-analog converter (DAC) register 284 provides a digital code to a DAC 285 which, in turn, generates the approximated voltage VTRK. The approximated voltage VTRK is compared against the input voltage VSEN by a comparator 288. The comparator 288 outputs a high signal to indicate that the internally-generated approximated voltage VTRK is greater than the input voltage VSEN, and outputs a low signal otherwise.

The up/down indicator output from the comparator 288 is provided to an ADC controller 282. The ADC controller 282 uses the up/down indicator from the comparator 288 to steer the approximated voltage VTRK higher or lower. If the up/down indicator indicates that the approximated voltage VTRK is higher than the input voltage VSEN, the ADC controller 282 decreases the value in the DAC register 284. If the up/down indicator indicates that the approximated voltage VTRK is lower than the input voltage VSEN, the ADC controller 282 increases the value in the DAC register 284. The ADC controller 282 adjusts the value of the DAC register 284 until the up/down indicator is toggling between its two states, thereby indicating that the approximated voltage VTRK has converged to the input voltage VSEN. Upon reaching this state or upon reaching the end of a sample period, the ADC controller 282 latches the final value provided to the DAC register 284 and outputs this value as the digitized voltage $V_{RECT\_DIG}$.

The rate at which the tracking ADC 280 can provide digital samples is determined by the speed at which the ADC controller 282 can adjust values for the DAC register 284, the number of iterations required for the approximated voltage VTRK to converge to the input voltage VSEN, and the time required for the input voltages VBUFP, VBUFN to settle to a steady-state value after a voltage transient. As will be discussed subsequently in conjunction with the waveforms of FIG. 6, the number of iterations may be reduced by preloading, at the rising edge of a rectified voltage pulse, the DAC register 284 with the last digitized voltage $V_{RECT\_DIG}$ stored from a prior rectified voltage pulse. Because the prior voltage pulse provides a good voltage estimate for a current voltage pulse, the tracking ADC 280 is able to converge more quickly. (The ADC front end 210 provides an edge indicator which the ADC controller 282 may use as a trigger to load a prior DAC value to the DAC register 284.) Additionally, the step size used in adjusting the DAC register values may be dynamically set such that large steps are used immediately upon detection of a rectified voltage pulse, and smaller steps are used after some number of iterations or after toggling of the up/down indicator is detected. For example, after preloading the DAC register 284 after a rectified voltage pulse is detected and after waiting for a settling period, the ADC controller 282 may begin adjusting the DAC register value by 7 code steps per iteration. Once the ADC controller 282 detects a change in the up/down indicator from the comparator 288, the ADC controller 282 may reduce the step size to 3 code steps for the next iterations. Once the up/down indicator from the comparator 288 again changes polarity, the ADC controller 282 may reduce the step size to 1 code step.

Fast settling of the input voltages to the tracking ADC 280 requires a low impedance (high current), which cannot be supplied directly by the high-impedance conditioning circuit 107. This problem is addressed by the high-bandwidth ADC front end 210.

The ADC front end 210 includes an edge detector 250, unity-gain buffers 260p, 260n, and a level shifter 220. The unity-gain buffers 260p, 260n provide buffered outputs VBUFP, VBUFN to the tracking ADC 280. The buffers 260p, 260n provide a low-impedance to the tracking ADC 280, and provide the high current levels required for fast voltage settling time. Because depletion-mode MOSFETs are generally not available in small channel-length technologies such as those used for fabricating the (largely digital) controller 170, e.g., 65 nm, the unity-gain buffers 260p, 260n use a push-pull output stage, comprised of N and P-channel enhancement-mode MOSFETs, to source/sink current to/from the tracking ADC 280.

However, use of enhancement-mode MOSFETs, rather than depletion-mode MOSFETs, in the push-pull output stage has some significant drawbacks. The output stage's n-channel MOSFET, which sinks current to ground, requires application of a gate-to-source control voltage of at least a few hundred millivolts (e.g., >600 mV) to conduct and provide the necessary buffering (unity-gain amplification). An output stage based upon such enhancement-mode MOSFETs is not capable of buffering voltages below these levels and, relatedly, is not capable of providing these low voltage levels at its output. To address this, the level shifter 220 shifts the input voltages VSENN, VSENP up, e.g., by 0.6V, thereby providing shifted voltages VSHFTN, VSHFTP to the buffers 260n, 260p. The combination of the level shifter 220 and the buffers 260n, 260p allows for the digitization of input voltages down to 0V. For example, input voltages between 0V and 2.1V may be level-shifted and buffered by the ADC front end 210 such that this voltage range may be accurately digitized by the tracking ADC 280. By using the same level shifter and buffer circuitry for both the first and second inputs VSENP, VSENN, the voltage sensor 200 achieves good common-mode rejection to mitigate inaccuracies that may be generated by noise in the power or ground supplies.

The level shifter 220 includes a first level shifter stage, which level shifts the first input voltage VSENP (also termed the signal voltage) and a second level shifter stage, which level shifts the second input voltage VSENN (also termed the reference voltage). The first level shifter stage comprises a current source 222p which provides a reference current $I_{REF}$ to a first p-channel MOSFET P1. The constant reference current $I_{REF}$ establishes a source-to-gate voltage $V_{SG1}$ which is positive and constant. (Stated alternatively, the gate-to-source voltage of the MOSFET P1 is negative.) This, in turn, provides the level-shifted output voltage VSHFTP=VSENP+$V_{SG1}$. The second level shifter stage is similarly configured, such that VSHFTN=VSENN+$V_{SG2}$. With the same reference current levels $I_{REF}$ provided by the current sources 222p, 222n, the source-to-gate voltages $V_{SG1}$, $V_{SG2}$ of the MOSFETS P1, P2 are nominally the same, thereby leading to the same voltage shift on the signal and reference input voltages (VSENP, VSENN).

The edge detector 250 compares the signal voltage input (VSENP) against a reference voltage VREF and provides an output that indicates, e.g., whether the input voltage (VSENP) is within an active pulse. For example, VREF may be set to 1V when the signal voltage VSENP is expected to toggle between 0 and 2V. The output of the edge detector 250 may be used, e.g., by components within the digital controller 170, to determine the duration of a rectified voltage pulse, to determine the lag between when the PWM generator 174 commands that an active pulse be generated on the primary side and when a corresponding rectified voltage pulse occurs on the secondary side, etc.

Level Shifters with Error-Compensation Feedback Circuitry

The level shifter 220 of FIG. 2 potentially produces minor-to-moderate inaccuracies as the input signal voltage VSENP varies over its range, as the supply voltage driving the current sources 222p, 222n varies from a nominal value, and/or as temperature varies. To provide accurate voltages VBUFP, VBUFN to the tracking ADC 280, the input voltages VSENP, VSENN should be shifted by the same voltage offset. This implies that the source-to-gate voltages $V_{SG1}$, $V_{SG2}$ of the MOSFETs P1, P2 are the same. While these voltages, as shown in FIG. 2, are nominally the same, the voltage range applied to the source signal input VSENP results in channel-length modulation for the source-follower topology illustrated in FIG. 2, and associated variation in the source-to-gate voltage $V_{SG1}$. For example, an active rectified pulse of 2V provided to the input VSENP results in a source-to-drain voltage $V_{SD1}$ of about 2.6V for the first MOSFET P1, and a source-to-drain voltage $V_{SD2}$ of about 0.6V for the second MOSFET P2. For the same current $I_{REF}$ through the MOSFETs P1, P2, this difference in their respective source-terminal voltages relative to their respective drain-terminal voltages leads to a difference in the source-to-gate voltage $V_{GS}$ for the MOSFETs P1, P2. While the resultant source-to-gate voltage difference is relatively small, e.g., on the order of 10 mV, and could be considered negligible in some contexts, this voltage difference is large enough to prevent accuracy levels down to 1%, as desired for the voltage sensor.

Figure 3:
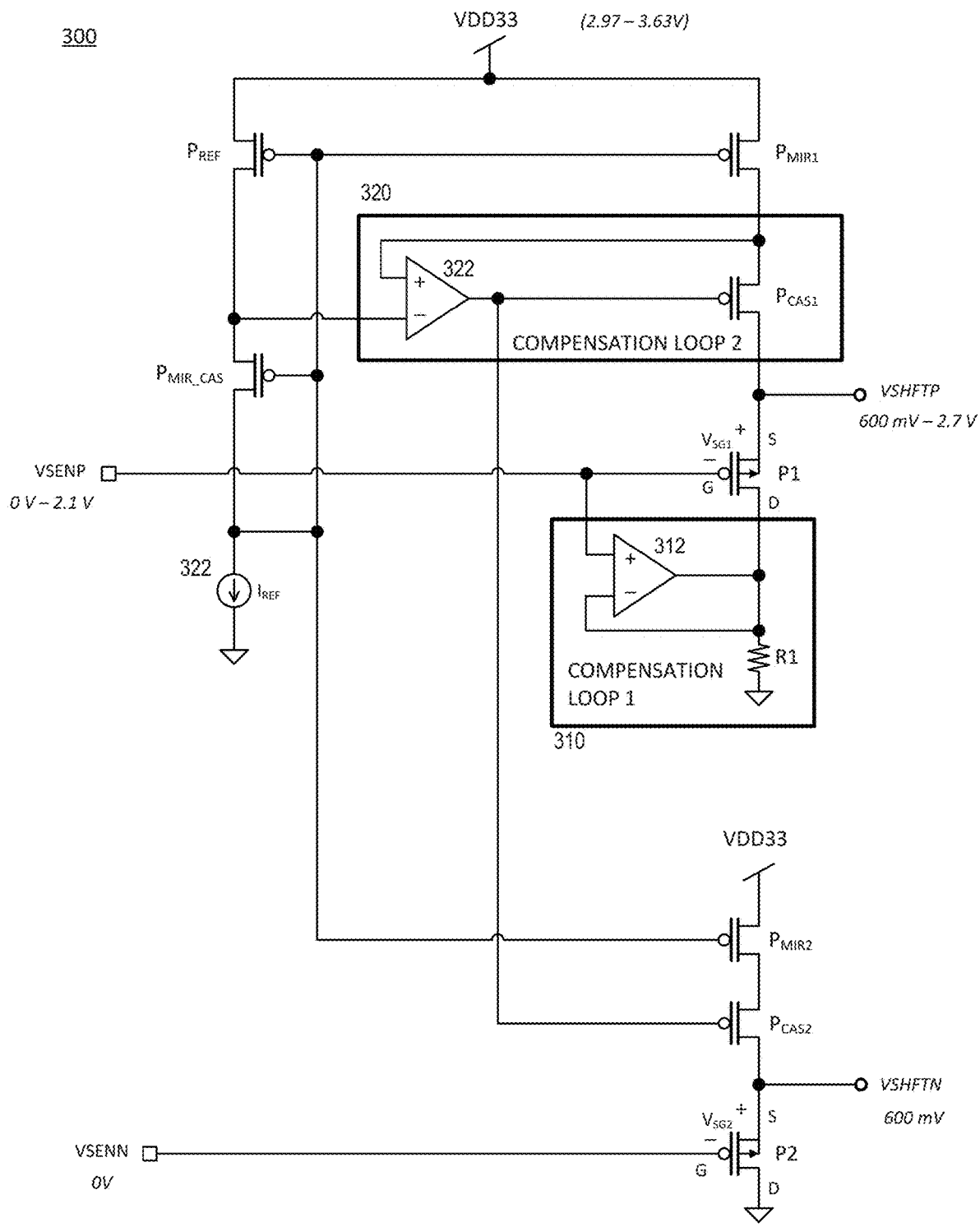
FIG. 3 illustrates circuitry for a level shifter that is part of an ADC front end, and which compensates for changes in input and supply voltage.

FIG. 3 illustrates detailed circuitry 300 for a level shifter similar to that of FIG. 2, but which includes error compensation loops to provide the same source-to-drain voltage levels for the MOSFETs P1, P2, so as to further improve the consistency of the level shifting provided by the source-follower level shifter circuits for both signal inputs VSENP, VSENN. By maintaining the same source-to-drain voltages for the MOSFETs P1, P2, the source-to-gate voltages $V_{SG}$ of the level-shifting MOSFETs P1, P2 are controlled to be even closer in value than the corresponding voltages for the level shifter 220 of FIG. 2.

The level shifter 300 includes a current mirror for providing a reference current $I_{REF}$ to both the first and second MOSFETs P1, P2. A power supply VDD33 provides a nominal voltage of 3.3V for the current mirror, but this voltage may vary by up to 10%, as denoted in the Figure. A current source 322 sets the reference current level $I_{REF}$. The current mirror further includes a reference p-channel MOSFET $P_{REF}$ together with first and second mirror MOSFETs $P_{MIR1}$, $P_{MIR2}$. The gate terminals for each of the mirror MOSFETS $P_{REF}$, $P_{MIR1}$, $P_{MIR2}$ are tied together, whereas each of the source terminals are tied to the power supply VDD33. Hence, the gate-to-source control voltage $V_{GS}$ is the same for each of the mirror MOSFETs, thereby forcing the same current $I_{REF}$ to flow through the first level-shifter stage, including MOSFET P1, and the second level-shifter stage, including MOSFET P2.

A first compensation loop 310 is configured to force the drain voltage of the first MOSFET P1 to be the same as the gate voltage of the first MOSFET P1. This compensation loop 310 includes a first amplifier 312 having differential inputs tied to the gate and drain terminals of the first MOSFET P1. The first amplifier 312 sources or sinks additional current, thereby augmenting the reference current $I_{REF}$, to a compensation resistor R1 such that the voltage drop across R1 is driven to be the same as the signal input voltage VSENP, i.e., the gate-to-drain voltage $V_{GD1}$=0 for the first MOSFET P1. The gate and drain terminals of the second MOSFET P2 are tied to the reference voltage (e.g., ground), such that no compensation loop is needed. With the gate and drain terminals having the same voltages for each of the MOSFETs P1, P2 and with both MOSFETs having the same current $I_{REF}$, channel modulation effects are eliminated meaning that both MOSFETs have the same source-to-drain voltage $V_{SD}$. This, in turn, forces the gate-to-source voltage $V_{GS}$ of each MOSFET P1, P2 to be nearly identical.

Channel modulation effects can also affect the mirror MOSFETs $P_{REF}$, $P_{MIR1}$, $P_{MIR2}$. Such effects are mitigated or eliminated by including cascode MOSFETS $P_{MIR\_CAS}$, $P_{CAS1}$, $P_{CAS2}$ and a second compensation loop 320. The second compensation loop 320 comprises a second amplifier 322 having differential inputs tied to the drain terminals of mirror MOSFETs $P_{REF}$, $P_{MIR1}$, thereby regulating the voltages at these drain terminals to be the same. The output of the second amplifier 322 is tied to the gate (control) terminals of first and second cascode MOSFETs $P_{CAS1}$, $P_{CAS2}$. The gate-to-source voltages $V_{GS}$ of these cascode MOSFETs $P_{CAS1}$, $P_{CAS2}$ are the same for the same current $I_{REF}$ flowing through them, i.e., they have the same voltages at their respective source terminals. This, in turn, means that the drain terminals for the mirror MOSFETs $P_{MIR1}$, $P_{MIR2}$ are at the same potential. Thus, each of the drain, source, and gate terminals are at the same respective voltages for each of the mirror MOSFETs $P_{REF}$, $P_{MIR1}$, $P_{MIR2}$, thereby ensuring that the reference current $I_{REF}$ is accurately replicated within the first level-shifter stage comprising MOSFET P1 and the second level-shifter stage comprising MOSFET P2. (The source-to-drain voltages $V_{SD}$ for the first and second cascode MOSFETs $P_{CAS1}$, $P_{CAS2}$ may be significantly different, but this has no substantive effect on the level-shifter voltages $V_{SG1}$, $V_{SG2}$ of the first and second MOSFETs P1, P2.)

The combination of the current mirror, the cascode MOSFETs and the compensation loops 310, 320 of the level shifter 300 drive the source-to-gate voltages of the MOSFETs P1, P2 to nearly identical values, thereby ensuring that the signal and reference signal input voltages VSENP and VSENN are shifted by the same amount, e.g., 600 mV.

The level-shifter circuit 300 of FIG. 3 typically provides highly accurate level shifting, e.g., 1% or better, over an expected range of the input voltage (e.g., VSENP–VSENN=0 to 2.1V), over variation in the power supply (e.g., +/–10% of VDD33), and over a large temperature range (e.g., –40° C. to 125° C.). This good accuracy is maintained presuming the level-shifting MOSFETs are well-matched in regards to offset and drift. Offset and drift may be minimized, e.g., by matching the biasing for the bulk, gate, and drain nodes, and by laying out the MOSFET devices together, but in separate wells. Even with these precautions, however, stress-related drift can cause inaccuracies to develop over time. P-channel MOSFET devices are particularly prone to stress-related drift and, notably, are more susceptible to such drift than corresponding N-channel MOSFET devices. P-channel MOSFETs having small channel lengths have significant issues with positive bias temperature instability.

Error Compensation for Stress-Related Drift

As alluded to above, stress effects cause the gain and/or offset for the MOSFETs (particularly the P-channel MOSFETs) of the level shifter circuitry and/or buffers to drift over time. Stresses due to temperature, pressure, and aging cause such drift. To maintain good voltage sensor accuracy, such drift must be mitigated, e.g., via compensating for the drift. This may be accomplished by measuring the voltage difference across the input voltages VSENP, VSENN, measuring the voltage difference across the buffer output voltages VBUFP, VBUFN, and applying a compensation that forces these voltage differences to be the same. Such compensation mitigates stress-related gain and offset drift for level-shifter circuitry and buffer circuitry within an ADC front end such as that illustrated in FIGS. 2 and 3.

Figure 4:
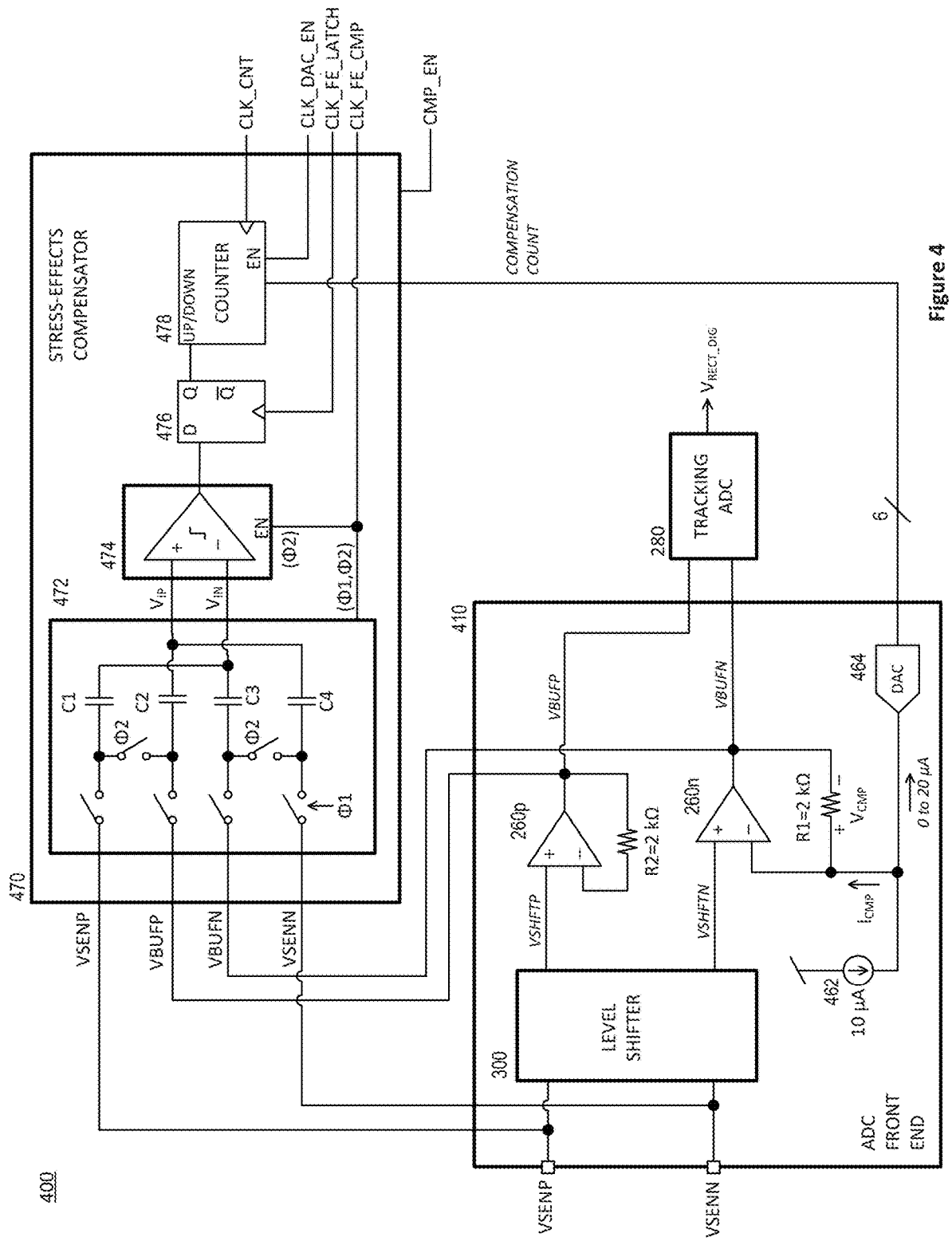
FIG. 4 illustrates circuitry for an ADC front end that corrects for errors due to various stress effects, wherein the correction uses digital compensation.

FIG. 4 illustrates voltage sensing circuitry 400 that includes compensation circuitry for mitigating stress-related drift. The voltage sensor 400 comprises an ADC front end 410 including a level shifter 300 and buffers 260n, 260p, and a tracking ADC 280. Each of these circuits is configured similarly to corresponding circuitry in FIG. 2 or 3 and, therefore, will not be described in further detail. Unlike the circuitry 200 of FIG. 2, the buffers 260n, 260p include feedback resistors R1, R2. A current DAC 464 and a current source 462 combine to potentially source or sink a compensation current $I_{CMP}$ through the first feedback resistor R1. The compensation current $I_{CMP}$ generates a compensation voltage $V_{CMP}$ across the first resistor R1, which may be used to compensate for gain and/or offset drift in the level shifter 300 and the buffers 260n, 260p. Rather than being coupled to the negative-side buffer 260n, a current DAC and current source could similarly be coupled to the positive-side buffer 260p. However, the illustrated embodiment is preferred, as providing compensation at the negative-side buffer 260n avoids channel-length modulation issues that might complicate compensation that is applied to the positive-side buffer 260p.

The illustrated current source 462 sources a current of 10 µA, whereas the current DAC 464 sinks between 0 and 20 µA, thereby leading to a range of ±10 µA for the compensation current $I_{CMP}$ and a range of ±20 mV for the compensation voltage $V_{CMP}$. The current DAC 464 preferably has a 6-bit digital input (64 levels), meaning that each DAC step corresponds to a current change of 0.3125 µA and a compensation voltage change of 0.625 mV. The input to the current DAC 464, which is denoted 'compensation count' in FIG. 4, is adjusted to achieve a compensation voltage $V_{CMP}$ such that the voltage input difference is equal to the buffered output difference, i.e., VSENP−VSENN=VBUFP−VBUFN. The current DAC 464 should be set to its midpoint, e.g., 32 for the 6-bit DAC illustrated, as an initial default, and may remain there if no stress-related compensation is required. Such a setting corresponds to a 10 µA current sunk by the DAC 464, and zero compensation voltage $V_{CMP}$ across the feedback resistor R1. The resolution of the DAC 464 is preferably ½ the resolution of the DAC 285 of the tracking ADC 280, so as to mitigate the effect of any noise introduced by the stress-effects compensation on the tracking ADC 280.

The digital input for DAC 464 is generated by a stress-effects compensator 470, which samples the input voltages VSENP, VSENN and the buffered voltages VBUFP, VBUFN, and adjusts the output of DAC 464 until the input and buffered voltage differences are the same, i.e., VSENP−VSENN=VBUFP−VBUFN. A compensation enable signal CMP_EN is input to the compensator 470 and enables its components when the stress-related compensation is being performed. Because stress-related effects typically occur slowly over time, the compensation enable signal CMP_EN may only be activated at a relatively low rate. If the DAC input (compensation count) is relatively stable, the compensation enable signal CMP_EN may disable the stress-effects compensator 470 so as to avoid unnecessary adjustments of the DAC 464, and the associated noise and power consumption. A compensation clock signal CLK_FE_CMP drives the rate at which compensation updates are provided when the compensator 470 is enabled. As explained more fully in relation to the waveforms of FIG. 6, the compensation provided by the stress-effects compensator 470 is preferably updated once for each pulse in the rectified voltage $V_{RECT}$, for the case when a rectified voltage is being sensed.

The stress-effects compensator 470 includes a switched-capacitor network 472, a comparator 474, a D flip flop 476, and an up/down counter 478. The switched-capacitor network 472 uses capacitors C1, C2, C3, C4 to sample the input and buffered voltages VSENN, VSENP, VBUFN, VBUFP. When the compensation clock CLK_FE_CMP is high, which is denoted as φ1 in FIG. 4, switches within a first set are closed so as to charge C1 with the voltage VSENP, C2 with the voltage VBUFP, C3 with the voltage VBUFN, and C4 with the voltage VSENN. During a second phase when the compensation clock CLK_FE_CMP is low, denoted as φ2 in FIG. 4, the switches of the first set are opened and switches within a second set are closed so as to connect capacitors C1 and C2, and capacitors C3 and C4. During this second phase (φ2), the input voltage to the comparator 474 is given by:

$$V_{IP} - V_{IN} = \frac{(VBUFP - VSENP) - (VBUFN - VSENN)}{2} \quad (1)$$

As seen from equation (1), driving the comparator inputs $V_{IP}-V_{IN}$ to zero is equivalent to driving VSENP−VSENN=VBUFP−VBUFN.

During the second phase (φ2) of the clock CLK_FE_CMP, the comparator 474 is enabled such that it amplifies and compares its input signals $V_{IP}$, $V_{IN}$. Once the pre-amplifiers of the comparator 474 have settled, the comparator 474 produces a digital high signal when $V_{IP}>V_{IN}$, and a digital low signal otherwise. The comparator output is latched by the D flip flop 476 responsive to a latch signal CLK_FE_LATCH. This latch signal is activated a settling time after the second phase (φ2) of the clock CLK_FE_CMP starts. For example, the comparator 474 is enabled when CLK_FE_CMP goes low and is known to settle within 100 ns. Hence, CLK_FE_LATCH is asserted 100 ns after a falling edge of CLK_FE_CMP, which causes the D flip flop 476 to latch the (settled) output from the comparator 474.

The output Q of the D flip flop 476 is input to an up/down selector of the counter 478. A count within the counter 478 is updated, according to the up/down selector input, for each cycle of the compensator. The counter 478 may be updated a small delay after the input of the D flip flop 476 has been latched by the latch signal CLK_FE_LATCH. As illustrated, the counter 478 is enabled by an enable signal CLK_DAC_EN and is clocked by a clock count signal CLK_CNT. The clock count CLK_CNT runs at a fairly fast rate, e.g., 100 MHz, whereas the enable signal CLK_DAC_EN provides an active pulse such that the counter is updated once per cycle of the compensator. For example, a 10 ns active pulse may be asserted on the enable signal CLK_DAC_EN a delay of 50 ns after the latch signal CLK_FE_LATCH rises. The 50 ns delay is included to allow time for the D flip flop 476 to settle after its latching, and the pulse width of 10 ns provides one update for a 100 MHz counter clock CLK_CNT. The counter 478 increases its count as long as $V_{IP}>V_{IN}$, and decreases its count otherwise. Once the counter 478 starts to toggle between two adjacent counts, the compensation voltage $V_{CMP}$ has converged to a voltage that compensates for stress-related drift.

As illustrated, the output of the counter 478 is provided to the current DAC 464. In an alternative embodiment (not illustrated), a latch may be inserted between the counter 478 and the DAC 464. The latch is enabled such that it inputs a new value from the counter 478 only after the counter has increased or decreased for several consecutive clock cycles, or after the count has changed by some threshold. Conversely, repeated toggling of the comparator output, and the associated toggling between two count values of the counter 478, indicates convergence. Detection of convergence may be used to stop latching (updating) the 'compensation count' provided to the current DAC 464, so as to avoid unnecessary noise. Relatedly, the stress-effects compensator 470 may be disabled, e.g., by setting the compensation enable signal CMP_EN inactive, which also saves power. The compensator 470 and/or the above-mentioned latch may be re-enabled after some time period or after detecting some other event likely to lead to stress-related drift, e.g., a temperature, voltage or time change above some threshold.

Alternative Error Compensation for Stress-Related Drift

Figure 5:
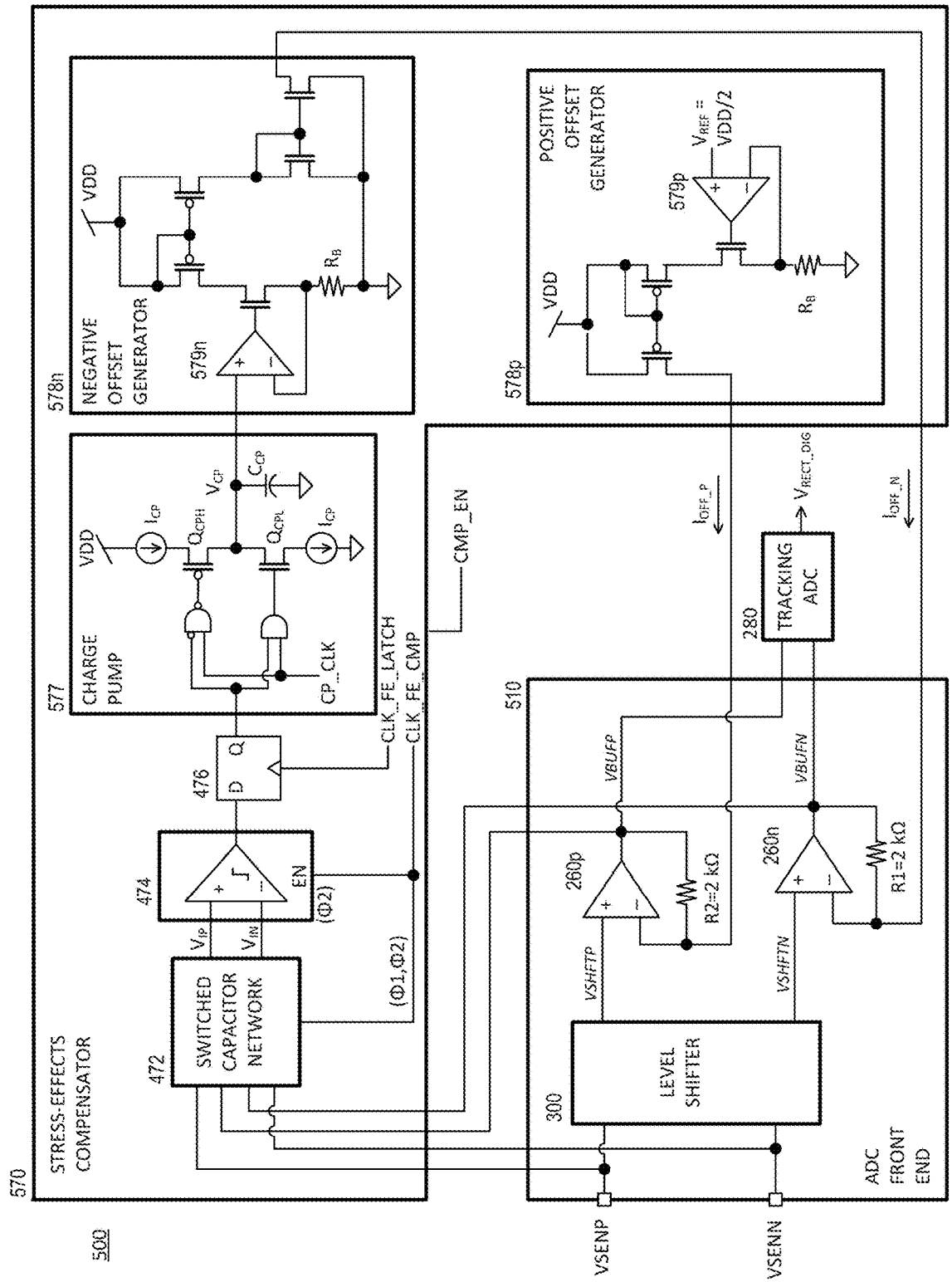
FIG. 5 illustrates circuitry for an ADC front end that corrects for errors due to various stress effects, wherein the correction uses a charge pump.

FIG. 4, and its description, provide a stress-related compensator 470 that makes use of a digital counter 478 and a current DAC 464. Other techniques may be preferred in some applications. FIG. 5 illustrates one such alternative embodiment of voltage sensing circuitry for compensating for stress-related drift. This circuit makes use of an analog charge pump to compensate for stress-related drift, rather than the digital counter 478 of FIG. 4. Much of the circuitry within the voltage sensing circuit 500 of FIG. 5 is the same or similar to corresponding circuitry within FIG. 4, and only circuitry that differs significantly is described below.

FIG. 5 illustrates voltage sensing circuitry 500 that includes an ADC front end 510 and a stress-related compensator 570. The ADC front end 510 is largely the same as that illustrated in FIG. 4, except that there is no current DAC for providing a compensation current to the feedback resistor R1 of the buffer 260n. Instead, the ADC front end 510 inputs offset currents $I_{OFF\_P}$, $I_{OFF\_N}$, which are applied to the feedback resistors R2, R1 of the buffers 260p, 260n, thereby generating offset voltages across the feedback resistors R2, R1, which may be used to compensate for stress-related drift. The offset currents $I_{OFF\_P}$, $I_{OFF\_N}$ are provided by the stress-related compensator 570.

The stress-related compensator 570 includes a switched-capacitor network 472, a comparator 474, and a D flip flop 476, each of which are connected as in FIG. 4. Also as in FIG. 4, a compensation enable signal CMP_EN may disable the stress-effects compensator 570, so as to avoid unnecessary adjustments of the offset currents $I_{OFF\_P}$, $I_{OFF\_N}$, and the noise and power consumption associated with such adjustments. The stress-related compensator 570 further includes a charge pump 577, a negative offset generator 578n, and a positive offset generator 578p. The positive and negative offset generators 578p, 578n provide the offset currents $I_{OFF\_P}$, $I_{OFF\_N}$ for the ADC front end 510. As in the compensator 470 of FIG. 4, the D flip flop 476 provides a high output when $V_{IP} > V_{IN}$, i.e., VBUFP–VBUFN>VSENP–VSENN, and a low output otherwise. However, the output of the D flip flop 476 is provided to the charge pump 577, rather than to a counter.

The charge pump 577 includes a MOSFET-based push-pull output stage, charge-pump current sources providing reference currents $I_{CP}$, and MOSFET drivers, which are illustrated as AND gates. A charge pump clock signal CP_CLK is input to the AND gates and determines whether the charge pump is active (sourcing/sinking current) or not. When the charge pump is active and the output of the D flip flop 476 is high, a low-side MOSFET $Q_{CPL}$ is turned on, thereby draining current $I_{CP}$ from a charge-pump voltage node $V_{CP}$, and associated charge from a charge-pump capacitor $C_{CP}$. This reduces the charge-pump voltage $V_{CP}$. When the charge pump is active and the output of the D flip flop 476 is low, a high-side MOSFET $Q_{CPH}$ is turned on, thereby sourcing current $I_{CP}$ to the charge-pump voltage node $V_{CP}$, and increasing the voltage at the node $V_{CP}$.

The negative offset generator 578n inputs the charge-pump voltage $V_{CP}$ and generates a negative offset current $I_{OFF\_N}$ based upon this voltage and the bias resistance $R_B$. More particularly, a buffer 579n replicates the charge-pump voltage $V_{CP}$ at one end of the bias resistor $R_B$, thereby generating a current $(V_{CP}/R_B)$. This current is replicated, via the illustrated current mirrors, so as to provide the offset current $I_{OFF\_N}=(V_{CP}/R_B)$ to the feedback resistor R1 within the ADC front end 510. As the buffered voltage difference increases above the input voltage difference, i.e., VBUFP–VBUFN>VSENP–VSENN, the charge pump voltage $V_{CP}$ is reduced and the offset current level $I_{OFF\_N}$ is lowered. This increases the buffered voltage VBUFN, thereby forcing the buffered voltage difference VBUFP–VBUFN to converge towards the input voltage difference VSENP-VSENN.

The positive offset generator 578p provides a bias current $I_{OFF\_P}$ to the feedback resistor R2 of the buffer 260p. This bias current $I_{OFF\_P}$ corresponds to the nominal offset current $I_{OFF\_N}$ that should be produced if the output of the D flip flop 476 (and the comparator 474) are toggling between high and low, i.e., as occurs when (VBUFP–VBUFN)≈(VSENP–VSENN). The bias current $I_{OFF\_P}$ is determined by setting the input to a buffer 579p to a reference voltage $V_{REF}$ that is midway between the supply voltage VDD for the charge pump and ground, i.e., $V_{REF}$=VDD/2. The buffer 579p replicates the reference voltage across a bias resistor $R_B$. The resultant current $I_{OFF\_P}=(V_{REF}/R_B)$ is replicated through a current mirror and provided to the feedback resistor R2 of buffer 260p, so as to generate a bias voltage across the feedback resistor R2.

As the buffered voltage difference VBUFP–VBUFN deviates from the input voltage difference VSENP–VSENN, the offset current $I_{OFF\_N}$ is adjusted from its nominal bias value (equivalent to $I_{OFF\_P}$) so as to produce a compensation voltage across the feedback resistor R1 which forces the buffered and input voltage differences to be the same, or nearly so.

Voltage Waveforms for the Voltage Sensor

Figure 6:
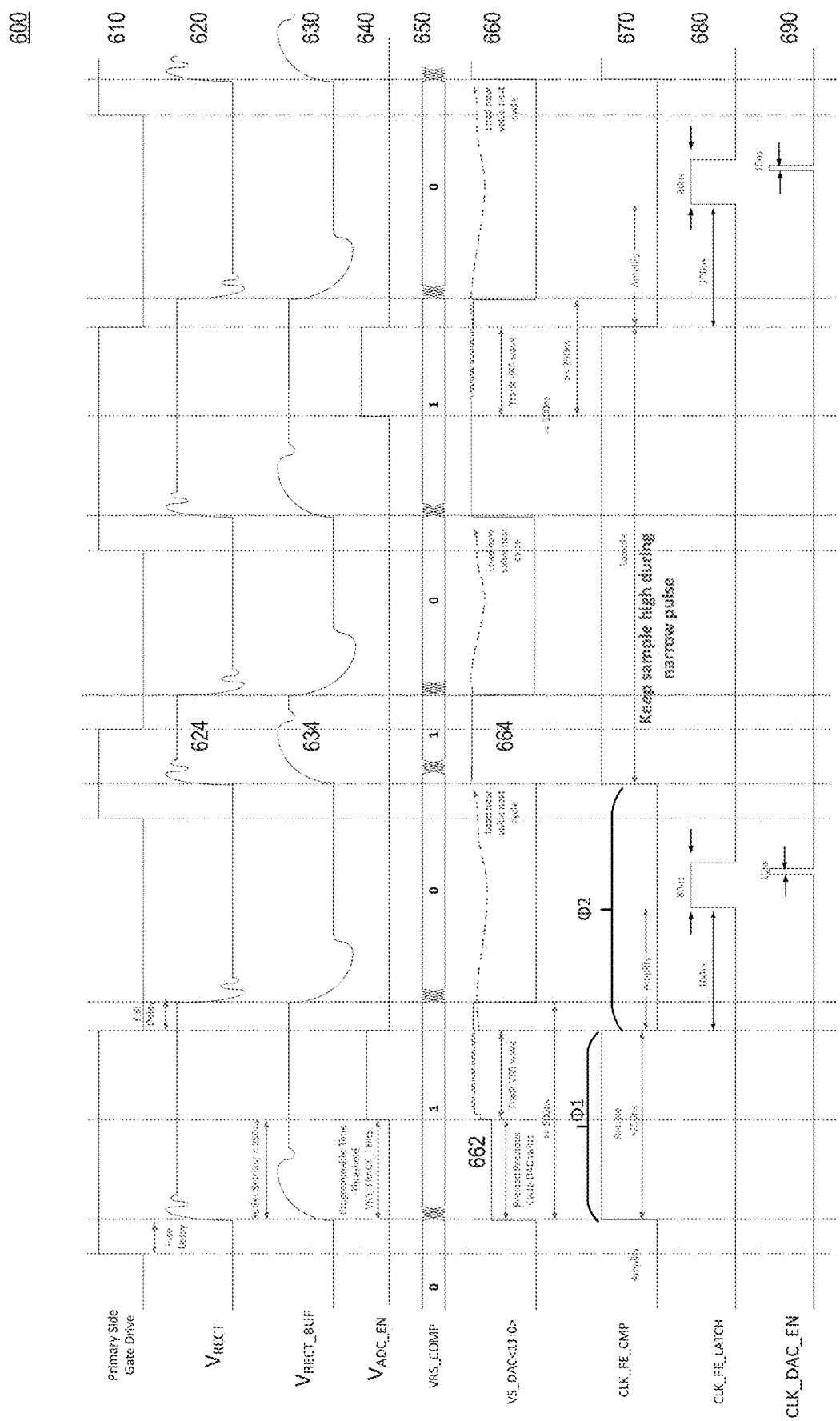
FIG. 6 illustrates waveforms corresponding to voltages and other signals within an isolated voltage converter making use of the voltage sensors described herein.

FIG. 6 illustrates waveforms 600 corresponding to the power converter 100 of FIG. 1 including the voltage sensing circuitry 400 of FIG. 4. A first waveform 610 corresponds to primary-side gate drive signals. Referring to the power converter 100 of FIG. 1, the first waveform 610 is high when active signals $V_{PWM\_Q1}$, $V_{PWM\_Q3}$ are generated to enable the power switches $Q_1$ and $Q_3$, and when active signals $V_{PWM\_Q2}$, $V_{PWM\_Q4}$ are generated to enable the power switches $Q_2$ and $Q_4$. Except for the delays through the isolator, drivers, and the power switches, the pulses of the first waveform 610 correspond to active (positive and negative) pulses applied across the input $V_{AB}$ to the transformer 120. A second waveform 620 corresponds to the rectified voltage $V_{RECT}$, e.g., as occurring at the rectified voltage node 106 of FIG. 1. A rising edge of the first waveform 610 leads to a rising edge in the rectified voltage waveform 620, after a delay denoted as 'Rise Delay' in FIG. 6. This delay includes delays through the isolator 130, the driver 112, the power switches $Q_1$, $Q_2$, $Q_3$, $Q_4$, and the transformer 120. A corresponding 'Fall Delay' occurs after a falling edge of the first waveform 610.

A third waveform 630, denoted $V_{RECT\_BUF}$ in FIG. 6, corresponds to the differential output of the ADC front end 410 of FIG. 4, i.e., $V_{RECT\_BUF}$=VBUFP−VBUFN. The impedance of the level shifter 300 and buffer 260p, 260n circuitry leads to rising and falling edges for $V_{RECT\_BUF}$ that slew at slower rates than the edges of the rectified voltage $V_{RECT}$. This is indicated by the 'Buffer Settling<250 ns' in the third waveform 630. The tracking ADC 280, as illustrated in FIGS. 2 and 4, should not be enabled until the differential output $V_{RECT\_BUF}$ has settled to a steady-state value. This is accomplished by waiting for a Programmable Time Threshold (VRS_TRACK_THRS) after a rising edge of $V_{RECT}$ is detected until the tracking ADC is enabled. This is illustrated in the fourth waveform 640, which shows an enable signal $V_{ADC\_EN}$ for the tracking ADC. Once the enable signal $V_{ADC\_EN}$ is activated, the tracking ADC 280 adjusts its tracking voltage VTRK, via the DAC 285, so as to converge to the digital rectified voltage $V_{RECT\_DIG}$. Rising and falling edges of the rectified voltage $V_{RECT}$ are detected by an edge detector, such as the edge detector 250 within FIG. 2, which generates an edge detection signal VRS_COMP. Such an edge indicator is illustrated in the fifth waveform 650 of FIG. 6.

A sixth waveform 660 illustrates the DAC value VS_DAC, which is provided to the DAC 285 and which determines the tracking voltage VTRK of the tracking ADC 280. Upon detection of a rising edge of the rectified voltage $V_{RECT}$, via the edge indicator VRS_CMP, the DAC register 284 is loaded with a value representing the DAC value from the previously-tracked rectified voltage pulse. After waiting for the time interval VRS_TRACK_THRS, the tracking ADC 280 begins operating and adjusts the value VS_DAC that is output from the DAC register 284. As illustrated in the pulse 662, the DAC value VS_DAC converges before the end of the pulse. In contrast to this, the second rectified voltage pulse 624 is so short that the buffered voltage pulse 634 has not had time to safely settle. The tracking ADC 280 loads a previous DAC value VS_DAC during the pulse 664. However, the tracking ADC 280 is not enabled and the DAC value VS_DAC does not get updated during this short pulse. Nonetheless, the tracking ADC 280 is able to provide a rectified voltage $V_{RECT\_DIG}$ corresponding to a previous value. At the falling edges of pulses of the rectified voltage $V_{RECT}$, as indicated by the edge indicator VRS_COMP, the DAC register 284 is preferably cleared (loaded with zero), so that a valid digital value $V_{RECT\_DIG}$ for the rectified voltage $V_{RECT}$ is also available during intervals when there is no active rectified pulse.

A seventh waveform 670 illustrates the compensation clock signal CLK_FE_CMP, as used by the stress-effects compensator 470 of FIG. 4. High levels of this clock signal correspond to a phase 1 interval (ϕ1), during which switches of the switched-capacitor network 472 are set to a sample mode. Low levels of this clock signal correspond to a phase 2 interval (ϕ2), during which the comparator 474 is set to its amplification mode (denoted 'Amplify' in FIG. 6). An eighth waveform 680 illustrates the latch signal CLK_FE_LATCH, which latches the output of the comparator 474 into the D flip flop 476. The latch signal CLK_FE_LATCH pulses high after the amplification mode has completed, which is illustrated as a 100 ns delay after a falling edge of the compensation clock signal CLK_FE_CMP. This delay provides sufficient time for the output of the comparator 474 to settle. A ninth waveform 690 illustrates the enable signal CLK_DAC_EN, which enables the counter 478. This signal pulses high some delay after a pulse of the latch signal CLK_FE_LATCH and, as illustrated, has a pulse width of 10 ns.

The delay between the rising edges of the latch signal CLK_FE_LATCH and the enable signal CLK_DAC_EN allows time for the output of the D flip flop 476 to settle. The pulse width of 10 ns enables the counter 478 long enough for its count to update, e.g., one period of a 100 MHz counter clock CLK_CNT.

Note that the second pulse 634 of the buffered rectified voltage $V_{RECT\_BUF}$ is also too narrow to allow for an iteration of the stress-effect compensation. The voltages provided to the stress-effects compensator 470 are not available long enough for the switched-capacitor network 474 to sample these voltages. This is shown by the waveform 650 for the edge indicator VRS_COMP, which indicates that the second pulse 634 does not last the 250 ns duration required for adequate sampling. Hence, there is no activation of the latch signal CLK_FE_LATCH for the second pulse 634, and there is no corresponding triggering of an iteration of the compensator 470.

Alternative Tracking ADC

Figure 7:
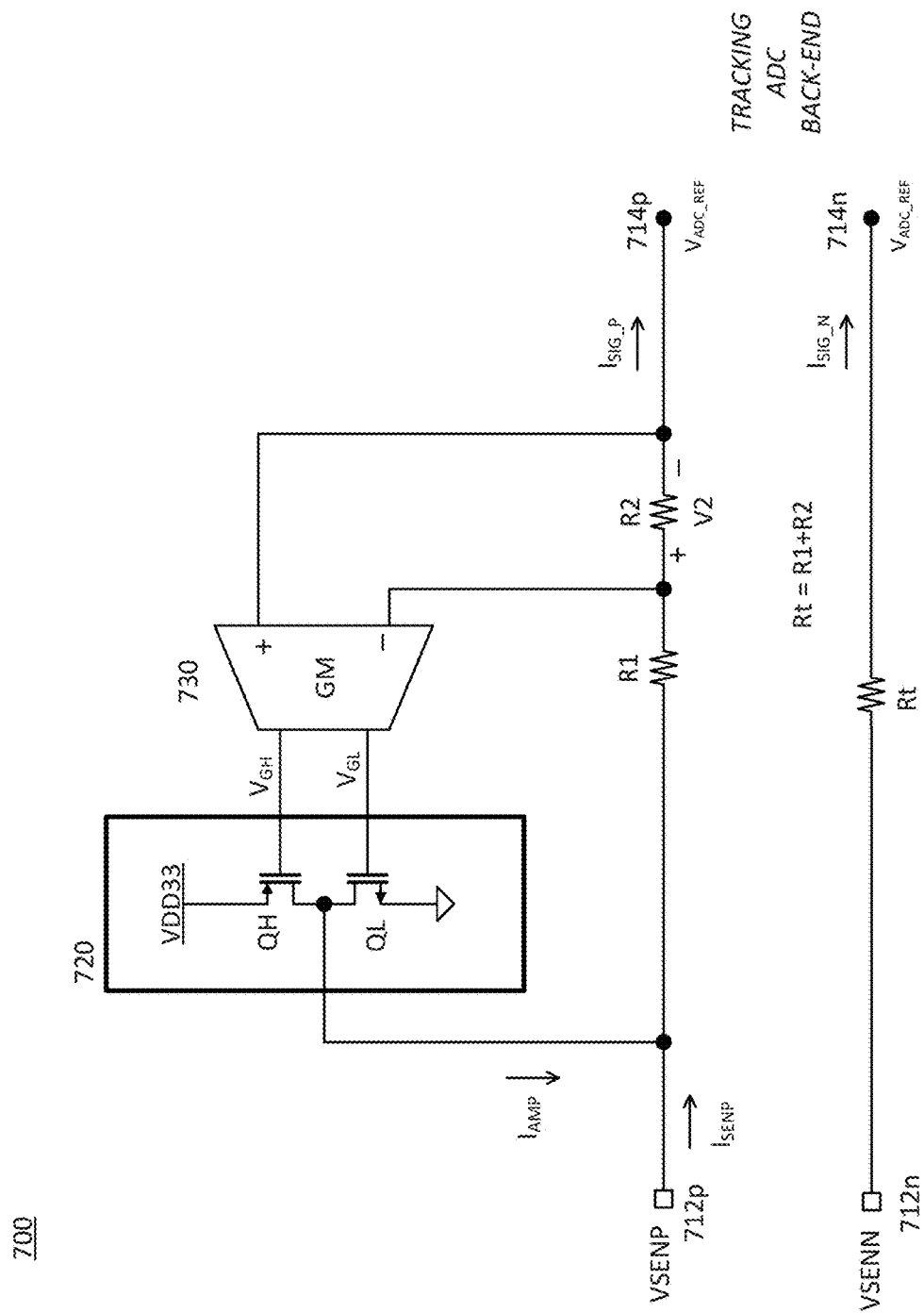
FIG. 7 illustrates circuitry for an alternative ADC front end which uses current amplifiers.

The ADC front-end circuitry described previously included level shifters and buffers. Such ADC front-end circuitry inputs a secondary-side voltage, e.g., $V_{RECT}$ in FIG. 1, from a high-impedance source and produces a high-current output, e.g., at VBUFP, VBUFN from FIG. 2, appropriate for input to a low-impedance tracking ADC. FIG. 7 illustrates an alternative to such ADC front end circuitry, which does not make use of rail-to-rail buffers. Instead, current amplification is built into the tracking ADC circuitry, via use of a push-pull output stage 720 and an amplifier-based driver 730.

A tracking ADC making use of a current-steering DAC may use resistors to connect positive and negative inputs, e.g., VSENP, VSENN, to positive and negative current summing nodes within the tracking ADC. These summing nodes are regulated to have a constant voltage, e.g., 700 mV. This regulated voltage, termed $V_{ADC\_REF}$ within FIG. 7, may be set, e.g., by gate-to-source voltages of MOSFETs of the tracking ADC. Rather than directly digitizing the input voltages VSENP, VSENN, the input voltages are converted to input currents $I_{SIG\_P}$, $I_{SIG\_N}$, which are digitized using the current-steering DAC and digital tracking logic for matching internally-generated currents to the input currents. In such a tracking ADC, a positive-side input current $I_{SIG\_P}$ is determined based upon the positive-side source voltage input VSENP, the regulated voltage $V_{ADC\_REF}$ of a summing node and an input resistance Rt. The positive-side input current $I_{SIG\_P}$ may thus be given by $I_{SIG\_P}$=(VSENP−$V_{ADC\_REF}$)/Rt. Similarly, the negative-side input current $I_{SIG\_N}$ may be given by $I_{SIG\_N}$=(VSENN−$V_{ADC\_REF}$)/Rt. (The resistances Rt between the positive and negative-side inputs VSENP, VSENN and the summing nodes are typically the same.) So as to achieve fast ADC conversion, the resistance Rt of the input resistors is preferably small so that the input currents $I_{SIG\_P}$, $I_{SIG\_N}$ are high and the current-steering DAC may quickly slew to match the input currents.

The tracking ADC 700 of FIG. 7 inputs voltages VSENP, VSENN from a conditioning circuit having a high impedance and which is not capable of supplying the high current levels desired for the input current $I_{SIG\_P}$. For example, the input voltages VSENP, VSENN may be supplied by the conditioning circuit 107 of FIG. 1, which divides down a rectified voltage $V_{RECT}$. The tracking ADC 700 includes a current amplifier that supplies a high current level for the positive-side input current $I_{SIG\_P}$, while the positive-side current $I_{SENP}$ provided by the positive-side input terminal 712p has a low current level due to the high impedance of its source, e.g., the conditioning circuit 107 of FIG. 1.

The tracking ADC 700 has input terminals 712p, 712n for connecting to the positive and negative-side source voltages VSENP, VSENN. The tracking ADC 700 has positive and negative-side summing nodes 714p, 714n, which are part of back-end tracking ADC circuitry. Positive and negative-side input currents $I_{SIG\_P}$, $I_{SIG\_N}$ flow to the summing nodes 714p, 714n from, typically, the input terminals 712p, 712n. The back-end ADC circuitry typically includes a current-steering DAC and digital tracking logic for determining digital values corresponding to the differential input source voltage VSENP-VSENN. Because such ADC back-end circuitry is well-known in the art, it is not shown in FIG. 7 and will not be described further herein. Instead, the unique aspects of the invention, which relate to providing the positive-side input current $I_{SIG\_P}$, are detailed below.

As the positive-side input voltage VSENP rises, e.g., at the beginning of a pulse in the rectified voltage $V_{RECT}$, the voltage VSENP increases to a level higher than the reference voltage $V_{ADC\_REF}$ of the positive-side summing node 714p. A current flows from the positive-side input terminal 712p to the positive-side summing node 714p through resistors R1, R2. This current induces a positive voltage drop V2 across the resistor R2, which corresponds to a negative differential input to the amplifier-based driver 730. The negative differential input voltage to the driver 730 activates an output gate drive signal $V_{GH}$ for the high-side MOSFET QH of the push-pull output stage 720, wherein the voltage level of the gate drive signal is based upon the voltage drop V2, e.g., $V_{GH}$=f(Gm,V2) where Gm is the gain of the amplifier-based driver 730. (The gate drive signal $V_{GH}$ may also require level shifting to generate an appropriate gate-to-source voltage, as is typical for transistor drive circuits.) The high-side MOSFET QH is turned on, such that the push-pull output stage 720 supplies an amplifier current $I_{AMP}$, wherein the level of the amplifier current $I_{AMP}$ is based upon the voltage drop V2. As the voltage VSENP rises, the amplifier current $I_{AMP}$ augments the input current $I_{SENP}$, so that little current $I_{SENP}$ is required from the input 712p. Upon reaching a steady-state after such an increase in the positive-side input voltage VSENP, the positive-side current $I_{SEN\_P}$ provided to the positive-side summing node 714p is sourced by the amplifier current $I_{AMP}$, such that no current is required from the positive-side input terminal 712p, i.e., $I_{SENP}$=0 and $I_{AMP}$=$I_{SIG\_P}$=(VSENP−$V_{ADC\_REF}$)/(R1+R2). High current may thus be provided to the (low-impedance) positive-side summing node 714p of the tracking ADC 700, without requiring high current levels from the positive-side input source VSENP, which typically is provided by a high-impedance source.

The tracking ADC 700 functions in a complementary fashion when the positive-side input voltage VSENP falls, e.g., at the end of a pulse in the rectified voltage $V_{RECT}$. As the positive-side input voltage VSENP decreases, the voltage V2 across resistor R2 decreases and the amplified current $I_{AMP}$ may be quickly reduced. Once the voltage VSENP decreases below the reference voltage $V_{ADC\_REF}$, a current flows from the positive-side summing node 714p to the positive-side input terminal 712p through the resistors R2, R1. This current induces a negative voltage V2 across the resistor R2 for the illustrated polarity. A positive differential input voltage is provided to the amplifier-based driver 730. This positive differential input voltage to the driver 730 activates an output gate drive signal $V_{GL}$ for the low-side MOSFET QL of the push-pull output stage 720, wherein the voltage level of the gate drive signal $V_{GL}$ is based upon the voltage drop V2, e.g., $V_{GL}$=Gm*V2 where Gm is the gain of the amplifier-based driver 730. The low-side MOSFET QL is turned on, such that the push-pull output stage 720 sinks the amplifier current (−$I_{AMP}$), wherein the level of the amplifier current $I_{AMP}$ is based upon the voltage drop V2. The positive-side input current $I_{SIG\_P}$ is thus able to react quickly to falling voltages at the positive-side input VSENP, despite the high impedance that may be provided at this input.

A negative-side resistor Rt is interposed between the negative-side input 712n and the negative-side summing node 714n, such that the positive and negative-side inputs 712p, 712n have the same impedance.

The tracking ADC 700 has the advantage of providing a simpler design in some implementations. The push-pull output stage 720 and amplifier 730 must be designed to be fast enough to respond adequately to changes in the input source voltage VSENP. The tracking ADC 700 has a disadvantage relative to the previously-described ADC front end circuitry in that the tracking ADC 700 cannot sink adequate current when the positive-side input voltage VSENP is falling to values near 0V. This is because the low-side MOSFET QL of the push-pull circuit is not capable of being turned on (and sinking current) at such low voltage levels for the positive-side input voltage VSENP.

Methods for Detecting Primary-Side Faults Based on Rectified Voltage

Figure 8:
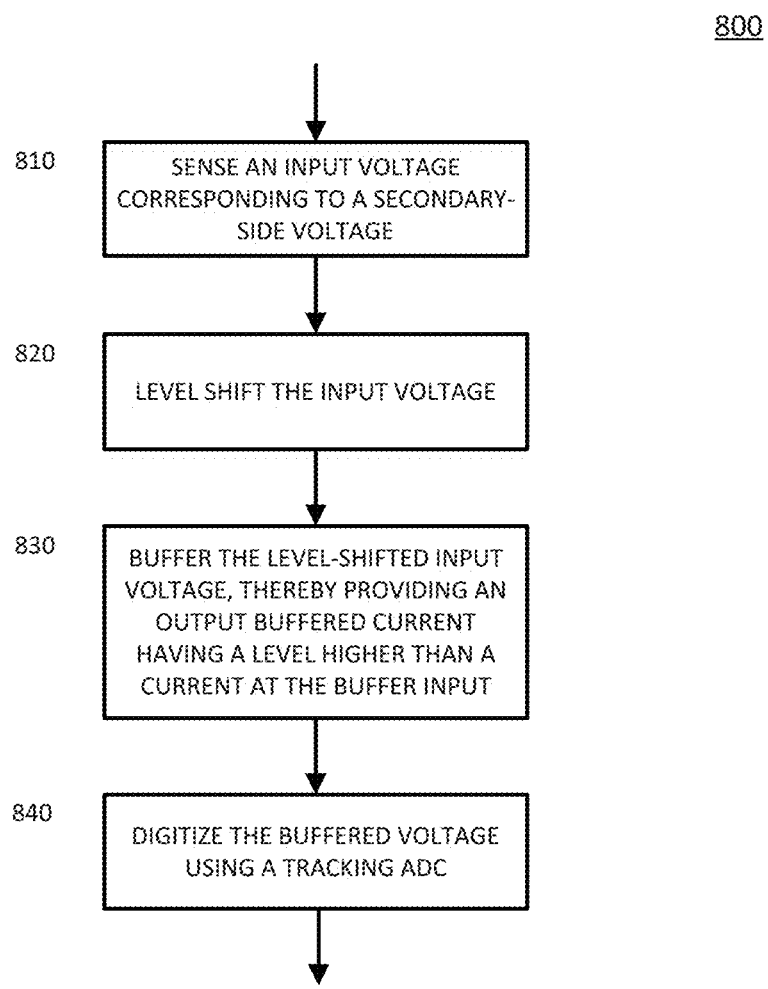
FIG. 8 illustrates a method for sensing a secondary-side voltage.

FIG. 8 illustrates a method 800 for sensing a secondary-side voltage within an isolated switched-mode power converter. This method may be implemented within a power converter such as that illustrated in FIG. 1. The method 800 begins by sensing 810 a first sense voltage at a first sense terminal. This first sense voltage corresponds to a secondary-side voltage, such as a rectified voltage or an output voltage of the power converter. The first sensed voltage is level shifted 820 to generate a first level-shifted voltage. The first level-shifted voltage is then buffered 830, so as to provide a first buffered output. A current corresponding to the first buffered output has a potentially higher level than the current provided at the buffer input. The voltage at the first buffered output is then digitized 840 using a tracking ADC.

In a typical application, the first sensed signal will correspond to a source voltage. The above method may be repeated for a second sensed signal, which corresponds to a reference voltage, e.g., ground.

According to an embodiment of a voltage sensor for tracking a secondary-side voltage of an isolated switched-mode power converter, the voltage sensor comprises a first sense terminal, a first level shifter, a first input buffer, and a tracking analog-to-digital converter (ADC). The first sense terminal is for connection to a node of the secondary-side voltage that is being tracked, and has a first sense voltage. The first level shifter is configured to shift the first sense voltage, thereby providing a first level-shifted voltage. This first level shifted voltage is provided to the first input buffer, which outputs a first buffered output having a voltage corresponding to the first level-shifted voltage, and having a first buffered current which is higher than a current input to the first input buffer. The tracking ADC digitizes the first buffered output so as to provide a digital value corresponding to the secondary-side voltage that is being tracked.

According to any embodiment of the voltage sensor, the voltage sensor further comprises an edge-detect comparator which is connected to the first sense terminal and is configured to detect a voltage pulse of the secondary-side voltage and, responsive to said pulse detection, to activate the tracking ADC.

According to any embodiment of the voltage sensor, its tracking ADC comprises a digital-to-analog converter (DAC) having a DAC output, and a DAC register whose stored value determines a voltage at the DAC output. The tracking ADC also includes a DAC comparator configured to compare a voltage at the ADC input with the voltage of the DAC output, and which provides a DAC comparator output indicating which of these voltages is higher. An ADC controller, also within the tracking ADC, is configured to update the stored value of the DAC register based upon the DAC comparator output. Activation of the tracking ADC comprises preloading the DAC register with a value from a previous active interval of the tracking ADC. In some embodiments, the edge-detect comparator is further configured to detect a falling edge of the voltage pulse, and the tracking ADC is configured to preload a zero to the DAC register responsive to receiving an indication of the detected falling edge from the edge-detect comparator. In some embodiments, the ADC controller is configured to alter the stored value of the DAC register by multiple steps (codes) when the ADC controller is initially activated, i.e., at the beginning of a pulse. The step size is reduced for subsequent iterations of the tracking ADC. In a further sub-embodiment, once the comparator output toggles, the step size is reduced.

According to any embodiment of the voltage sensor, the voltage sensor further comprises a second sense terminal, a second level shifter, and a second input buffer. The second sense terminal is for connecting to a reference node having a second sense voltage corresponding to a secondary-side reference voltage. The second level shifter shifts the second sense voltage, thereby providing a second level-shifted voltage. The second input buffer inputs the second level-shifted voltage, and provides a second buffered output having a voltage corresponding to the second level-shifted voltage. The current capability provided by the second buffered output is higher than the input current of the second input buffer. The tracking ADC is configured to output a digital value based upon a voltage difference between the first and second buffered outputs.

According to any embodiment of the voltage sensor having first and second sense terminals, and first and second level shifters, the first and second level shifters are part of a level-shifter circuit which includes a first MOSFET, a second MOSFET, a current source, and a current mirror. Each of the first and second MOSFETs comprises a first terminal, a second terminal, and a gate terminal, wherein the gate terminal controls conduction between the first and second terminals. The gate terminal of the first MOSFET is coupled to the first sense terminal, and the first level-shifted voltage is provided at the first terminal of the first MOSFET. The gate terminal of the second MOSFET is coupled to the second sense terminal, and the second level-shifted voltage is provided at the first terminal of the second MOSFET. The current source provides a reference current to the current mirror. The current mirror comprises three MOSFETs, which are configured to provide the reference current to the first and second MOSFETs.

According to any embodiment of the voltage sensor having such a level-shifter circuit, the level-shifter circuit further includes a first feedback correction loop configured to drive a voltage at the second terminal of the first MOSFET to a voltage at the gate terminal of the first MOSFET. The first feedback correction loop includes a first amplifier having a first input coupled to the gate terminal of the first MOSFET, a second input, and an output coupled to the second input and to the second terminal of the first MOSFET. A feedback correction loop resistor is coupled to the output of the first amplifier such that the first amplifier can source/sink current through the resistor so as to maintain voltages at the gate and second terminals of the first MOSFET at a common level.

According to any embodiment of the voltage sensor having such a level-shifter circuit, with or without the first feedback correction loop, the level-shifter circuit further comprises a second feedback correction loop which is configured to maintain a common voltage at the second terminals of the first and second mirror MOSFETs. The second feedback correction loop comprises a second amplifier having a first input coupled to the second terminal of the first mirror MOSFET, a second input coupled to the second terminal of the second mirror MOSFET, and an output. In further embodiments of this voltage sensor, the level-shifter circuitry also includes first and second cascade MOSFETs. The first cascade MOSFET is interposed between the second mirror MOSFET and the first MOSFET, and has a gate terminal coupled to the output of the second amplifier. The second cascade MOSFET is interposed between the third mirror MOSFET and the second MOSFET, and has a gate terminal coupled to the output of the second amplifier.

According to any embodiment of the voltage sensor having first and second sense terminals, and first and second level shifters, the voltage sensor also includes a drift compensation circuit. A drift compensation current or voltage source is configured to compensate for a difference between a buffered voltage difference and a sensed voltage difference, wherein the first buffered voltage difference is a difference between the first and the second buffered outputs, and the sensed voltage difference is a difference between the first and second sense voltages. A capacitor and switch network is configured such that capacitors store, during a first phase interval, voltages corresponding to each of the first sense voltage, the first buffered output, the second sense voltage, and the second buffered output. During a second phase interval, the capacitor and switch network provides a first difference between the first buffered output and the first sense voltage, and a second difference between the second buffered output and the second sense voltage. A drift compensation comparator is coupled to the capacitor and switch network, and generates a drift compensation output based upon a comparison of the first and the second differences. The drift compensation current or voltage source is based on the drift compensation output.

According to any embodiment of the voltage sensor, the voltage sensor provides a digital output for each switching period or for each switching half period of the isolated switched-mode power converter. This digital output corresponds to the digital value output from the tracking ADC.

According to an embodiment of a method for sensing a secondary-side voltage within an isolated switched-mode power converter, the method comprises sensing a first sense voltage at a first sense terminal, wherein the first sense voltage corresponds to the secondary-side voltage. The first sense voltage is shifted, thereby providing a first level-shifted voltage. The first level-shifted voltage is buffered, so as to provide a first buffered output having a voltage corresponding to the first level-shifted voltage. The available current driven from the first buffered output is higher than the input current of the first input buffer. The output of the first buffer is digitized using a tracking analog-to-digital converter (ADC), so as to provide a digital value corresponding to the secondary-side voltage.

According to an embodiment of a switched-mode power converter using an isolated topology for converting power from an input source into power for an output load, the switched-mode power converter comprises a primary side, a transformer, and a secondary side. The primary side includes a power stage, coupled to the input source, which includes one or more power switches. The transformer includes a primary winding coupled to the power stage and a secondary winding. The secondary side includes a rectifier circuit, a filter circuit, and a voltage sensor. The rectifier circuit is coupled to the secondary winding and provides a first rectified voltage at a first rectified voltage node. The filter circuit is interposed between the first rectified voltage node and an output of the switched-mode power converter. The filter circuit is configured to filter the first rectified voltage and provides a filtered voltage at the output. The voltage sensor comprises circuitry that is largely the same as the voltage sensor described above, but additionally includes a resistive voltage divider which couples the secondary side voltage node being sensed to a sense terminal of the voltage divider.

According to any embodiment of the switched-mode power converter, the secondary-side voltage node that is coupled to the resistive voltage divider is the first rectified voltage node. According to a further embodiment of this switched-mode power converter, the digital value corresponding to the rectified voltage node is used to estimate an input current and/or voltage of the input source. According to yet a further embodiment of this switched-mode power converter, the voltage sensor further comprises an edge-detect comparator that is configured to determine a width of a rectified voltage pulse at the rectified voltage node. According to yet a further embodiment of this switched-mode power converter, the voltage sensor further comprises an edge-detect comparator configured to detect an edge of a rectified voltage pulse at the rectified voltage node, and the switched-mode power converter further comprises a controller configured to generate control signals for the power switches of the primary side, and to determine a time delay between the generated control signals and the detected edge of the rectified voltage pulse.

According to any embodiment of the switched-mode power converter, the secondary-side voltage node that is coupled to the resistive voltage divider is the output of the switched-mode power converter.

According to an embodiment of an alternative switched-mode power converter using an isolated topology for converting power from an input source into power for an output load, the switched-mode power converter comprises a primary side, a transformer, and a secondary side. These circuits are largely the same as the corresponding circuits of the switched-mode power converter described above, except for the voltage sensor of the secondary side. The voltage sensor of the alternative power converter is configured to estimate a voltage of the input source based upon a first rectified voltage. This voltage sensor comprises a first sense terminal, a front end and a tracking analog-to-digital converter (ADC).

According to any embodiment of the alternative switched-mode power converter, the front end comprises a current amplifier coupled to the first sense terminal and configured to amplify a first input current of the first sense terminal and provide a first amplified current to the tracking ADC. According to a further embodiment of this alternative switched-mode power converter, the current amplifier comprises a push-pull output stage, first and second resistors, and an amplifier-based driver. The push-pull output stage includes a first and second transistor which are coupled in series and interposed between a voltage sensor supply and a reference voltage node. A second terminal of the first transistor and a first terminal of the second transistor are coupled to the first sense terminal of the voltage sensor. The first and a second resistors are coupled in series and interposed between the first sense terminal and an input of the tracking ADC. The first amplifier-based driver has inputs coupled to terminals of the second resistor. A first output of the driver is coupled to a control terminal of the first transistor, and a second output of the driver is coupled to a control terminal of the second transistor.

According to any embodiment of the alternative switched-mode power converter, the front end comprises a first level shifter and the first level shifter is interposed between the first sense terminal and an input of the tracking ADC.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switched-mode power converter using an isolated topology for converting power from an input source into power for an output load, the switched-mode power converter comprising: a primary side including a power stage coupled to the input source and comprising one or more power switches; a transformer comprising a primary winding coupled to the power stage, and a secondary winding; and a secondary side including: a rectifier circuit coupled to the secondary winding and configured to provide a first rectified voltage at a first rectified voltage node, a filter circuit interposed between the first rectified voltage node and an output of the switched-mode power converter, the filter circuit configured to filter the first rectified voltage, thereby providing a filtered voltage at the output, and a voltage sensor comprising: a resistive voltage divider coupled to a secondary-side voltage node; a first sense terminal for connection to a divided voltage output from the resistive voltage divider, the first sense terminal having a first sense voltage; a first level shifter for shifting the first sense voltage, thereby providing a first level-shifted voltage; a first input buffer configured to input the first level-shifted voltage, and to provide a first buffered output having a voltage corresponding to the first level-shifted voltage and having a first buffered current which is higher than a current at the input of the first input buffer; and a tracking analog-to-digital converter (ADC) having an ADC input coupled to the first buffered output and configured to output a present digital value corresponding to the secondary-side voltage at a present sample instant, wherein a previous digital value output at a previous sample instant serves as an initial estimate for determining the present digital value.

2. The switched-mode power converter of claim 1, wherein the secondary-side voltage node coupled to the resistive voltage divider is the first rectified voltage node.

3. The switched-mode power converter of claim 2, wherein the present digital value corresponding to the first rectified voltage node is used to estimate an input current and/or voltage of the input source.

4. The switched-mode power converter of claim 2, wherein the voltage sensor further comprises an edge-detect comparator that is configured to determine a width of a rectified voltage pulse at the first rectified voltage node.

5. The switched-mode power converter of claim 2, wherein the voltage sensor further comprises an edge-detect comparator configured to detect an edge of a rectified voltage pulse at the first rectified voltage node, and the switched-mode power converter further comprises:
   a controller configured to generate control signals for the power switches of the primary side, and to determine a time delay between the generated control signals and the detected edge of the rectified voltage pulse.

6. The switched-mode power converter of claim 1, wherein the secondary-side voltage node coupled to the resistive voltage divider is the output of the switched-mode power converter.

7. The switched-mode power converter of claim 1, wherein the voltage sensor further comprises an edge-detect comparator which is connected to the first sense terminal and is configured to detect a voltage pulse of the secondary-side voltage and, responsive to said pulse detection, to activate the tracking ADC.

8. The switched-mode power converter of claim 1, wherein the tracking ADC comprises:
   a digital-to-analog converter (DAC) having a DAC output;
   a DAC register whose stored value determines a voltage of the DAC output;
   a DAC comparator configured to compare a voltage of the ADC input with a voltage of the DAC output and provide a DAC comparator output indicating which of these voltages is higher; and
   an ADC controller configured to update the stored value of the DAC register based upon the DAC comparator output,
   wherein activating the tracking ADC comprises preloading the DAC register with a value from a previous active interval of the tracking ADC.

9. A voltage sensor for tracking a secondary-side voltage of an isolated switched-mode power converter, the voltage sensor comprising: a first sense terminal for connection to an input node having a first sense voltage corresponding to the secondary-side voltage; a first level shifter for shifting the first sense voltage, thereby providing a first level-shifted voltage; a first input buffer configured to input the first level-shifted voltage, and to provide a first buffered output having a voltage corresponding to the first level-shifted voltage and having a first buffered current which is higher than a current at the input of the first input buffer; and a tracking analog-to-digital converter (ADC) having an ADC input coupled to the first buffered output and configured to output a present digital value corresponding to the secondary-side voltage at a present sample instant, wherein a previous digital value output at a previous sample instant serves as an initial estimate for determining the present digital value.

10. The voltage sensor of claim 9, further comprising an edge-detect comparator which is connected to the first sense terminal and is configured to detect a voltage pulse of the secondary-side voltage and, responsive to said pulse detection, to activate the tracking ADC.

11. The voltage sensor of claim 10, wherein the tracking ADC comprises:
   a digital-to-analog converter (DAC) having a DAC output;
   a DAC register whose stored value determines a voltage of the DAC output;
   a DAC comparator configured to compare a voltage of the ADC input with a voltage of the DAC output and provide a DAC comparator output indicating which of these voltages is higher; and
   an ADC controller configured to update the stored value of the DAC register based upon the DAC comparator output,
   wherein activating the tracking ADC comprises preloading the DAC register with a value from a previous active interval of the tracking ADC.

12. The voltage sensor of claim 11, wherein the edge-detect comparator is further configured to detect a falling edge of the voltage pulse, and the tracking ADC is configured to preload a zero to the DAC register responsive to receiving an indication of the detected falling edge from the edge-detect comparator.

13. The voltage sensor of claim 11, wherein the ADC controller is configured to, upon activation of the tracking ADC, alter the stored value of the DAC register by a step size of multiple steps for each tracking iteration, and to decrease the step size during subsequent iterations of the tracking ADC.

14. The voltage sensor of claim 9, further comprising:
   a second sense terminal for connection to a reference node having a second sense voltage corresponding to a secondary-side reference voltage;
   a second level shifter for shifting the second sense voltage, thereby providing a second level-shifted voltage; and
   a second input buffer configured to input the second level-shifted voltage, and to provide a second buffered output having a voltage corresponding to the second level-shifted voltage and having a second buffered current which is higher than a current at the input of the second input buffer,
   wherein the tracking ADC is configured to output a digital value based upon a voltage difference between the first and second buffered outputs.

15. The voltage sensor of claim 14, wherein the first level shifter and the second level shifter are part of a level-shifter circuit, and the level shifter circuit comprises:
   a first p-channel metal-oxide semiconductor field-effect transistor (pMOSFET) having a first terminal, a second terminal, and a gate terminal, wherein the gate terminal is coupled to the first sense terminal, the gate terminal controls conduction between the first and second terminals, and the first level-shifted voltage is provided at the first terminal of the first pMOSFET;
   a second pMOSFET having a first terminal, a second terminal, and a gate terminal, wherein the gate terminal is coupled to the second sense terminal, the gate terminal controls conduction between the first and second terminals, and the second level-shifted voltage is provided at the first terminal of the second pMOSFET;
   a level-shifter current source providing a reference current level;
   a current mirror comprising first, second, and third mirror MOSFETs configured to set currents for the first and the second pMOSFETs to the reference current level, wherein each of the mirror MOSFETs has a gate terminal, a first terminal, and a second terminal.

16. The voltage sensor of claim 15, wherein the level-shifter circuit further includes a first feedback correction loop configured to drive a voltage at the second terminal of the first pMOSFET to a voltage at the gate terminal of the first pMOSFET, the first feedback correction loop comprising:
   a first amplifier having a first input coupled to the gate terminal of the first pMOSFET, a second input, and an output coupled to the second input and to the second terminal of the first pMOSFET; and
   a feedback correction loop resistor coupled to the output of the first amplifier.

17. The voltage sensor of claim 15, wherein the level-shifter circuit further includes a second feedback correction loop configured to maintain a common voltage at the second terminals of the first and second mirror MOSFETs, the second feedback correction loop comprising:
   a second amplifier having a first input coupled to the second terminal of the first mirror MOSFET, a second input coupled to the second terminal of the second mirror MOSFET, and an output.

18. The voltage sensor of claim 17, further comprising:
   a first cascade MOSFET interposed between the second mirror MOSFET and the first pMOSFET, and having a gate terminal coupled to the output of the second amplifier; and
   a second cascade MOSFET interposed between the third mirror MOSFET and the second pMOSFET, and having a gate terminal coupled to the output of the second amplifier.

19. The voltage sensor of claim 14, further comprising a drift compensation circuit which comprises:
   a drift compensation current or voltage source configured to compensate for a difference between a buffered voltage difference and a sensed voltage difference, wherein the buffered voltage difference is a difference between the first and the second buffered outputs, and the sensed voltage difference is a difference between the first and second sense voltages;
   a capacitor and switch network configured such that capacitors store, during a first phase interval, voltages corresponding to each of the first sense voltage, the first buffered output, the second sense voltage, and the second buffered output, and provide, during a second phase interval, a first difference between the first buffered output and the first sense voltage and a second difference between the second buffered output and the second sense voltage; and
   a drift compensation comparator coupled to the capacitor and switch network, and configured to generate a drift compensation output based upon a comparison of the first and the second differences,
   wherein the drift compensation current or voltage source is based on the drift compensation output.

20. The voltage sensor of claim 9, wherein the voltage sensor provides a digital output for each switching period or for each switching half period of the isolated switched-mode power converter, the digital output comprising the present digital value output from the tracking ADC.

21. The voltage sensor of claim 9, wherein shifting the first sense voltage comprises shifting the first sense voltage by a positive voltage offset.

22. A method for sensing a secondary-side voltage within an isolated switched-mode power converter, the method comprising: sensing a first sense voltage at a first sense terminal, the first sense voltage corresponding to the secondary-side voltage; shifting the first sense voltage, thereby providing a first level-shifted voltage; buffering the first level-shifted voltage, so as to provide a first buffered output having a voltage corresponding to the first level-shifted voltage and having a first buffered current, which is higher than a current at the input of the first input buffer; and digitizing the first buffered output using a tracking analog-to-digital converter (ADC), so as to provide a present digital value corresponding to the secondary-side voltage at a present sample instant, wherein a previous digital value output at a previous sample instant serves as an initial estimate for determining the present digital value.

23. The method of claim 22, wherein shifting the first sense voltage comprises shifting the first sense voltage by a positive voltage offset.

* * * * *